United States Patent
Furukawa et al.

(10) Patent No.: US 6,385,156 B1
(45) Date of Patent: *May 7, 2002

(54) POSITIONING STRUCTURE OF A FLEXIBLE PRINTED CIRCUIT FOR A PICK-UP USED IN A DISC DRIVE AND PICK-UP ASSEMBLY USED IN A DISC DRIVE

(76) Inventors: Ken'ichi Furukawa; Kouji Teranishi; Satoru Manabe; Hiroyuki Morita, all c/o Mitsumi Electric Co., Ltd. of 8-8-2, Kokuryo-cho, Chofu-shi, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/052,327

(22) Filed: Mar. 31, 1998

(51) Int. Cl.[7] .................................................. G11B 7/00

(52) U.S. Cl. ....................................................... 369/100

(58) Field of Search ............................... 369/44.14, 112, 369/75.2, 100; 360/106, 104, 105

(56) References Cited

U.S. PATENT DOCUMENTS

| 4,965,684 A |   | 10/1990 | Stefansky ................. 360/78.12 |
| 5,023,498 A |   | 6/1991 | Abe .............................. 310/71 |
| 5,023,861 A |   | 6/1991 | Champagne et al. |
| 5,303,104 A |   | 4/1994 | Aruga et al. |
| 5,541,788 A | * | 7/1996 | Ishida et al. .............. 360/98.01 |
| 5,555,228 A | * | 9/1996 | Izuka ....................... 369/44.15 |
| 5,583,720 A |   | 12/1996 | Ishida et al. |
| 5,751,518 A | * | 5/1998 | Konno et al. ................ 360/104 |
| 5,892,747 A | * | 4/1999 | Okada et al. ............... 369/75.1 |
| 5,901,014 A | * | 5/1999 | Hiraoka et al. .............. 360/104 |

FOREIGN PATENT DOCUMENTS

| DE | 196 16 976 A1 | 10/1996 |
| EP | 0 537 707 A2 | 4/1993 |
| GB | 2 275 911 A | 9/1994 |

* cited by examiner

Primary Examiner—Brian E. Miller
Assistant Examiner—Tod Kupstas
(74) Attorney, Agent, or Firm—Patents + TMS

(57) ABSTRACT

A positioning structure of a flexible printed circuit for a pick-up used in a disc drive is disclosed. The structure comprises a turntable driven by a motor for supporting a disc thereon, a pick-up movable in a radial direction of the disc for reproducing information recorded on the disc to be supported on the turntable, a chassis provided with the turntable and the pick-up and having an opening and positioning members provided at or near the opening, a printed circuit board arranged below the chassis and provided with electrical circuits for inputting and outputting electrical signals to and from the pick-up, and a flexing printed circuit for connecting the pick-up to the printed circuit board through the opening of the chassis, wherein the flexible printed circuit is formed with engaging members to be engaged with the positioning members, respectively. This structure is capable of positioning the flexible printed circuit with respect to the chassis easily and reliably.

4 Claims, 16 Drawing Sheets

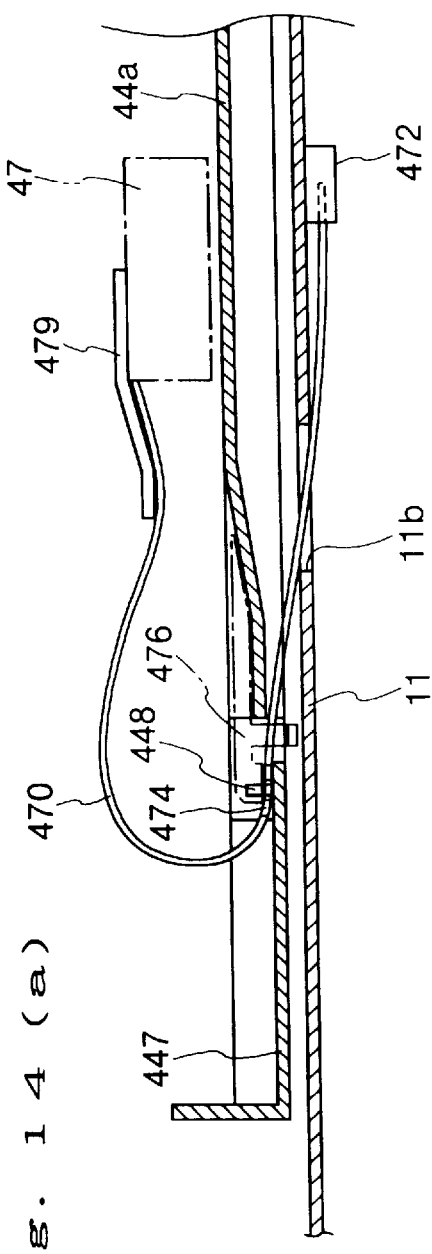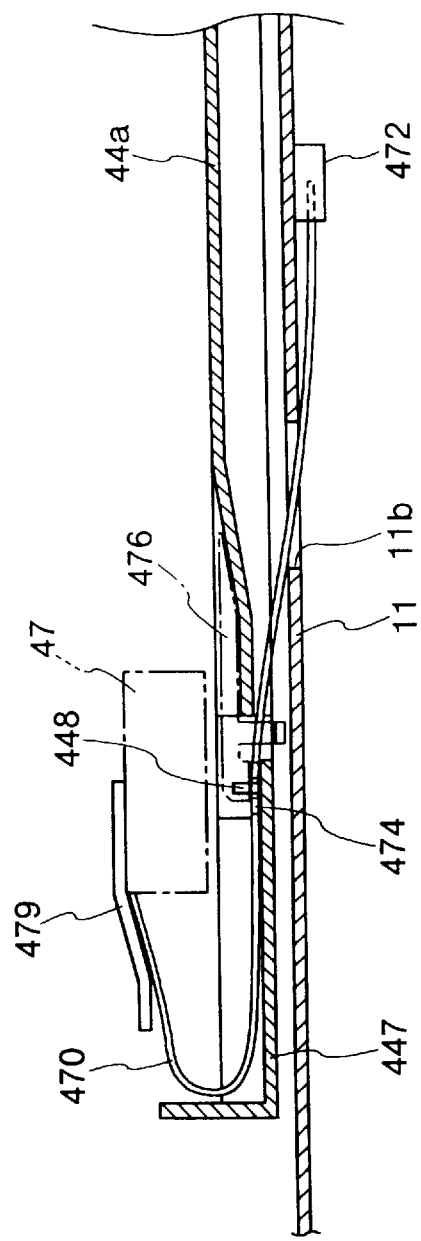
Fig. 14(a)
Fig. 14(b)

POSITIONING STRUCTURE OF A FLEXIBLE PRINTED CIRCUIT FOR A PICK-UP USED IN A DISC DRIVE AND PICK-UP ASSEMBLY USED IN A DISC DRIVE

BACKGROUND OF THE INVENTION

1. Field of the Invention

This invention relates to a positioning structure of a flexible printed circuit for a pick-up used in a disc drive and a pick-up assembly used in a disc drive. In particular, this invention relates to a positioning structure of a flexible printed circuit which is connected to an optical pick-up used in a disc drive to input and output various electrical signals to and from the optical pick-up, and also relates to an optical pick-up assembly which includes an optical pick-up and a flexible printed circuit connected to the optical pick-up.

2. Description of the Prior Art

Disc drives such as CD-ROM drives are provided with an optical pick-up for reading out information recorded on a CD-ROM, and the disc drives read out (playback) information which is recorded on the disc through a great number of pits formed spirally on the disc using the optical pick-up. Further, in CD-R drives, in addition to the playing back operation, it is further possible to write new information on the disc using the optical pick-up.

In these disc drives, there are provided a turntable on which a disc is placed and which is rotated by a motor, an optical pick-up (hereinafter, referred to as "pick-up") for reading out signals recorded on the disc placed on the turntable, and a sliding feed mechanism for moving the pick-up in a radial direction of the disc, and they are provided on a chassis of a main body of the disc drive. Further, below the chassis, there is arranged a printed circuit board. On the printed circuit board, there are provided electrical circuits and electronic parts and the like for processing signals read out from the disc by the pick-up and carrying out servo controls for the pick-up. The pick-up and the printed circuit board are connected with each other with a flexible printed circuit which passes through an opening formed in the chassis.

In this flexible printed circuit, there are provided a plurality of conductors for supplying signals reproduced by the pick-up and other various signals for focusing servo control and tracking servo control and the like, thus it is formed so as to have a relatively large width. The end portion of the flexible printed circuit is connected to a predetermined connector provided on the printed circuit board, and then electrically connected to the electrical circuits and the electronic parts through the connector.

Meanwhile, the optical pick-up moves in the radial direction over a wide range when the disc drive is turned on to move the pick-up for initialization or when track jump is performed upon seek operation. When the pick-up moves in this way, the flexible printed circuit also moves with changing its form within the chassis, and at such a time if the flexible printed circuit abuts the disc, the disk is liable to be damaged. Further, if such a flexile printed circuit is caught by any part or component, there is a case that the pick-up can not move further or the flexible printed circuit is damaged. Furthermore, there is a case that an excessive load is applied to the connecting portion between the flexible printed circuit and the optical pick-up due to the movement of the pick-up, and such a load may result in a connection failure. Moreover, when the pick-up moves toward the center of the disc, the flexible printed cable is somewhat pulled, and if such a pulling force is transmitted to the connecting part on the printed circuit board, there may arise a loosening of the connector and a connection failure.

Further, since it is required for the pick-up to be moved in the radial direction of the disc with a very high accuracy during disc playing back operation being carried out, it is required for the flexible printed circuit not to affect such accurately controlled movement of the pick-up.

For these reasons, in the conventional disc drives, in order to keep the length of a portion of the flexible printed circuit that lies within the space in the chassis in a constant length and avoid the pulling force caused by the movement of the pick-up from being transmitted to the connector on the printed circuit board, a vinyl tape or the like is wound around a prescribed portion of the flexible printed circuit to position it with respect to the chassis.

However, in such a method using the tape wound around the flexible printed circuit, there is a case that the position of the wound tape is displaced or the wound tape is loosened due to the pulling force caused by the movement of the pick-up.

Further, in the conventional structure, there is another problem in that dust or dirt enters into the space above the chassis in which the optical pick-up or the like are provided from the opening formed in the chassis due to a sucking force (negative pressure) created by high speed rotation of the disc during the operation, which results in malfunction of the optical pick-up if the dust is attached to the objective lens.

Further, in the method using the wound tape, there still remain the problem that a load is applied to the connection portion between the pick-up and the flexible printed circuit by the movement of the pick-up.

SUMMARY OF THE INVENTION

The present invention has been made in view of the problems in the positioning structure of the flexible printed circuit used in the prior art disc drives. Accordingly, it is a main object of the present invention to make it possible to position the flexible printed circuit with respect to the chassis easily and reliably.

Another object of the present invention is to prevent dust or dirt from entering into the space above the chassis from the side of the printed circuit board though the opening through which the flexible printed circuit extends.

Other object of the present invention is to prevent a load from being applied to the connecting part between the flexible printed circuit and the pick-up by the movement of the pick-up and give an ideal curved form to the flexible printed circuit so as not to disturb the movement of the pick-up.

In order to achieve these objects, the present invention is directed to a positioning structure of a flexible printed circuit for a pick-up used in a disc drive, which comprises:

a turntable for supporting a disc thereon, the turntable being driven by a motor;

a pick-up at least for reproducing information recorded on the disc to be supported on the turntable, the pick-up being movable in a radial direction of the disc;

a chassis provided with the turntable and the pick-up, and the chassis having an opening and a positioning means provided at or near the opening;

a printed circuit board arranged below the chassis and provided with electrical circuits for inputting and outputting electrical signals to and from the pick-up; and a flexing printed circuit for connecting the pick-up to the printed circuit board through the opening of the chassis, wherein the flexible printed circuit is formed with an engaging means to be engaged with the positioning means.

According to the present invention having the structure as described above, even when the optical pick-up moves over large range in the radial direction of the disc due to an initializing operation at starting or a track jumping operation, a pulling force caused by the movement of the optical pick-up is not transmitted to the connector on the printed circuit board since the pair of the engaging portions of the flexible printed circuit are in engagement with the protruding parts formed on the supporting plate, respectively.

In the present invention, it is preferred that the positioning structure of the flexible printed circuit further includes a closure member for covering the opening of the chassis. In this case, it is preferred that the closure member is removably attached to the chassis. By provision of such a closure member, it is possible to prevent dust or dirt from entering into the space above the chassis from the side of the printed circuit board through the opening due to a sucking force created by the high speed rotation of the disc.

Further, it is preferred that the positioning means is formed from a pair of protruding portions provided near said opening, and the engaging means of said flexible printed circuit is formed from a pair of concave portions integrally formed on the opposite sides of the flexible printed circuit perpendicular to the longitudinal direction of the flexible printed circuit so as to engage with the protruding portions, respectively. In this way, it is possible to position the flexible printed circuit with respect to the chassis easily and reliably and to keep the length of the portion of the flexible printed circuit which lies on the upper side of the chassis constant.

Further, it is also preferable to further comprise a regulating member provided at a connection part of the flexible printed circuit and the pick-up for regulating an extending direction of the flexible printed circuit from the pick-up so as to give a desired curved form to the flexible printed circuit. In this way, it is possible to avoid a load is applied to the connecting part between the pick-up and the flexible printed circuit by the movement of the pick-up as well as to provide the flexible printed circuit an ideal curved form which does not disturb the movement of the pick-up.

Other objects, structures and advantages of the present invention will be apparent when the following detailed description of the preferred embodiment will be considered taken in conjunction with the accompanying drawings.

BRIEF DESCRIPTION OF THE DRAWINGS

FIGS. 14(a) and 14(b) are explanatory drawings which respectively shows a curved form of the flexible printed circuit according to the movement of the optical pick-up;

DETAILED DESCRIPTION OF THE PREFERRED EMBODIMENTS

A detailed description of the preferred embodiments of a positioning structure of a flexible printed circuit for a pick-up used in a disc drive according to the present invention will now be given below with reference to the appended drawings.

Figure 1:
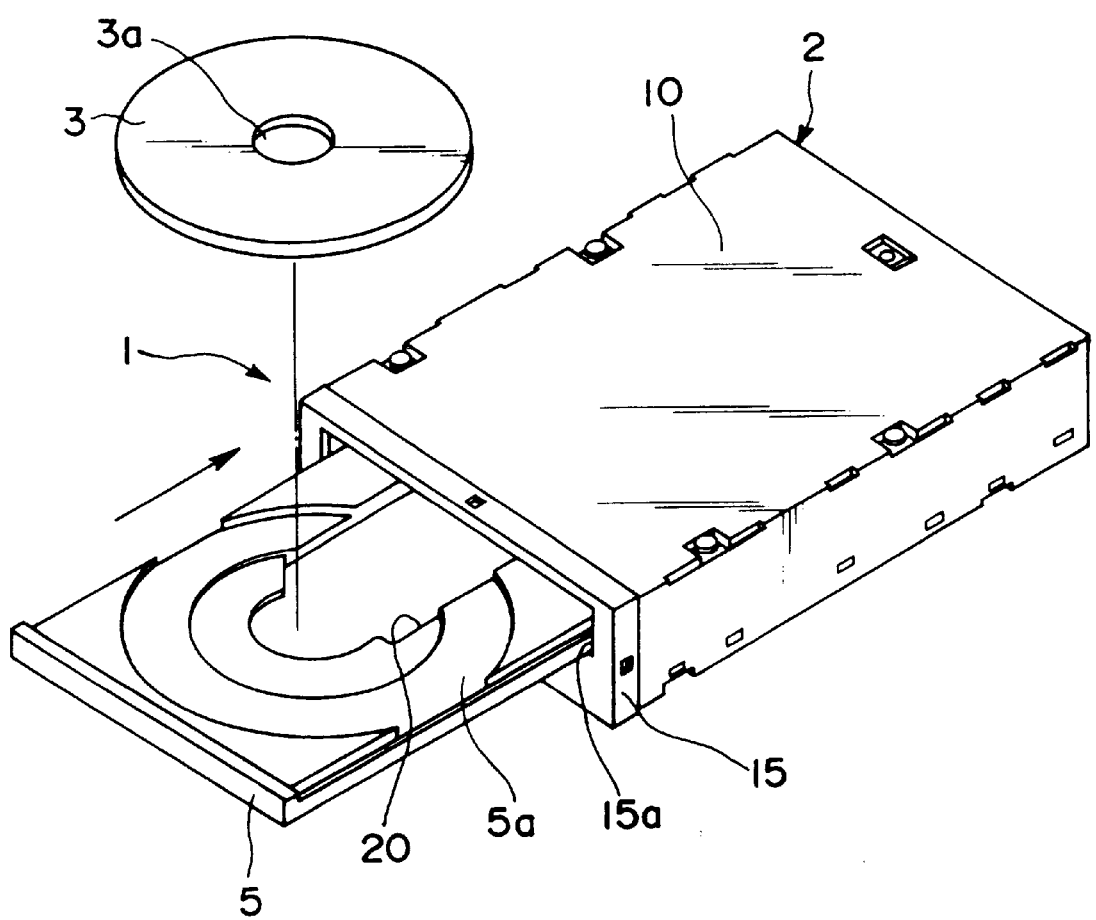
FIG. 1 is a perspective view which shows an external appearance of a disc drive to which a positioning structure of a flexible printed circuit of the present application is applied.
Figure 2:
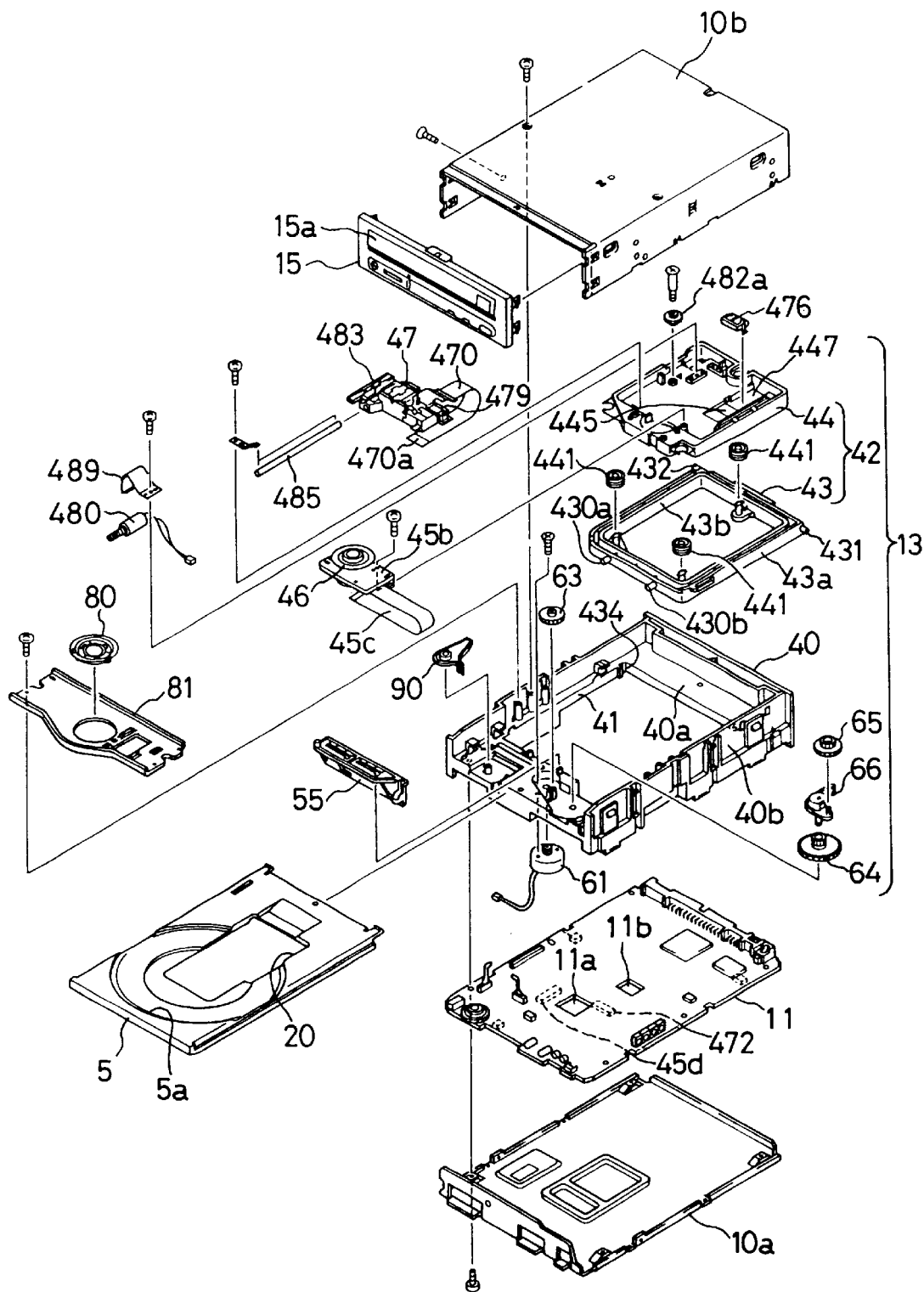
FIG. 2 is an exploded view of the disc drive shown in FIG. 1.
Figure 3:
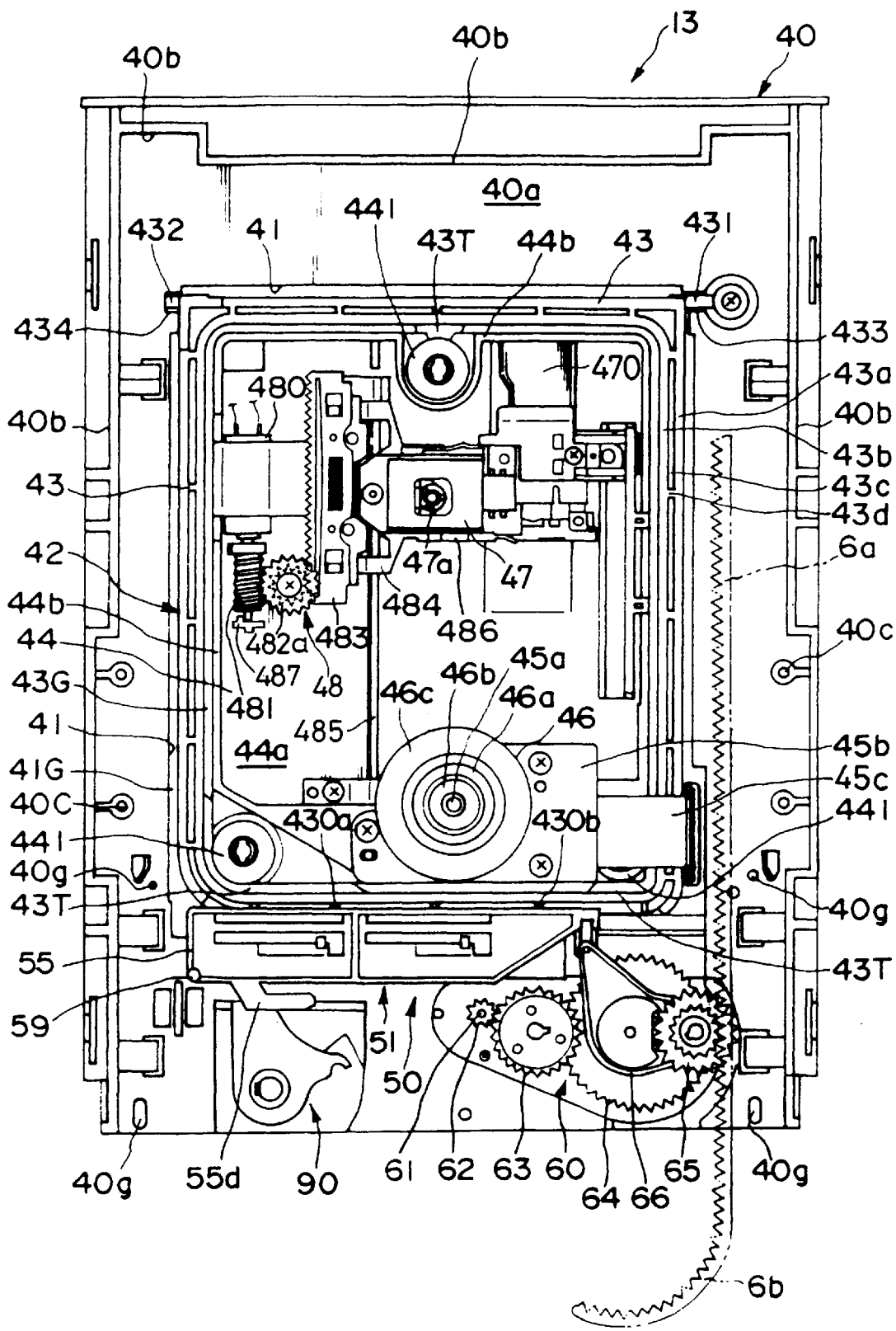
FIG. 3 is a planar view of a main body of the disc drive from which a casing is removed, in which a mechanism unit is shown in a lowered position.
Figure 4:
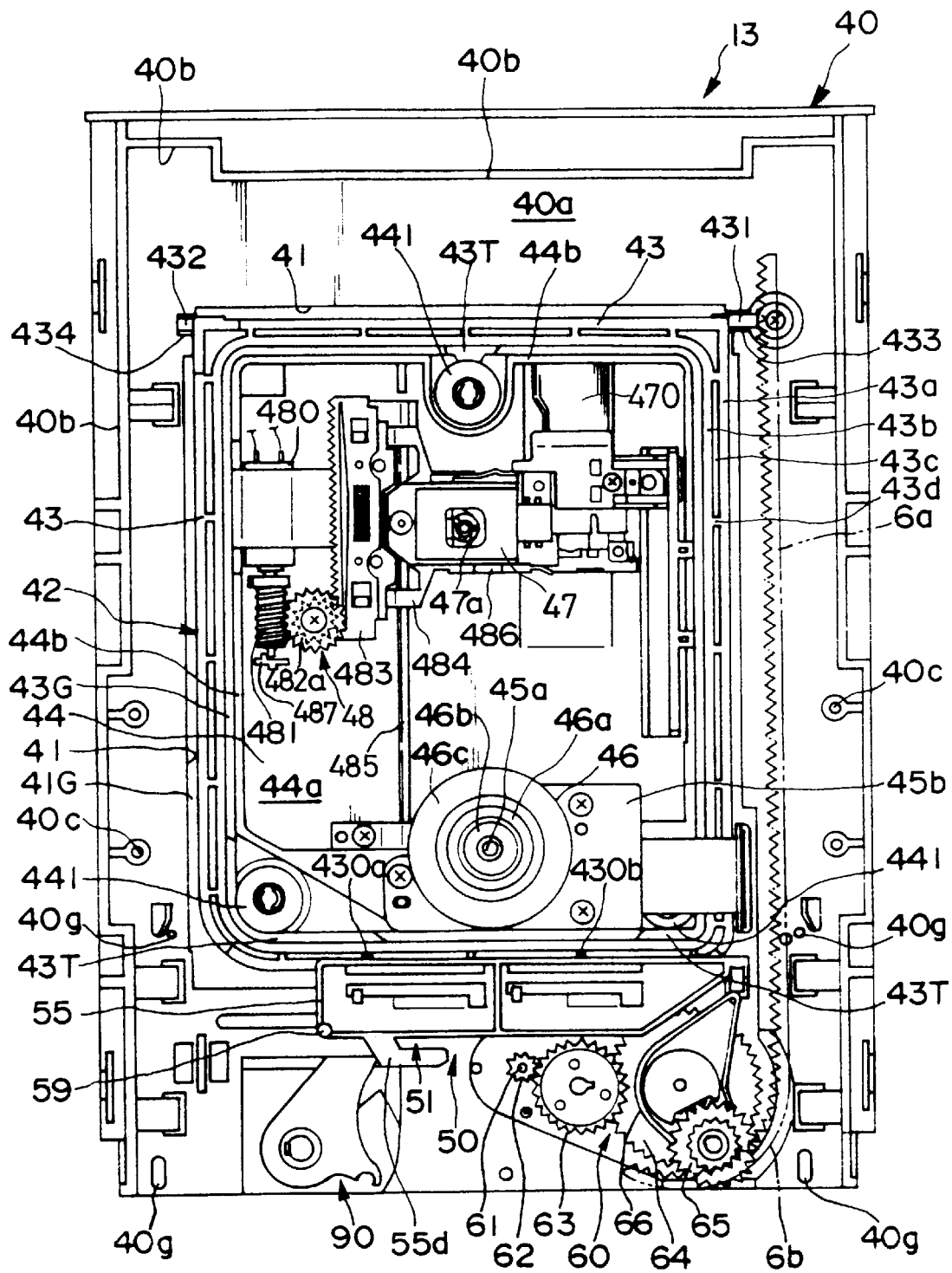
FIG. 4 is another planar view of the main body of the disc drive from which the casing is removed, in which the mechanism unit is shown in a raised position.

FIG. 1 is a perspective view which shows an external appearance of an disc drive to which a positioning structure of a flexible printed circuit of the present application is applied, FIG. 2 is an exploded perspective view of the disc drive, FIG. 3 is a planar view of a main body of the disc drive from which a casing is removed, which shows a state in which a mechanism unit is in a lowered position (lower position), and FIG. 4 is another planar view of the main body, which shows a state in which the mechanism unit is in a raised position (upper position).

As shown in FIG. 1, the disc drive 1 is configured into a CD-ROM drive, CD-R drive or the like for playing back or recording and playing back an optical disc 3. The disc drive 1 is roughly constructed from a main body 2 and a disc tray 5 which is movable in the forward and backward direction (horizontal direction) with respect to the main body 2 for transporting the optical disc 3.

As shown in FIG. 2, the main body 2 is roughly constructed from a printed circuit board 11, a mechanism assembly 13 provided on the printed circuit board 11 and a casing 10 which houses the printed circuit board 11 and the mechanism assembly 13. The casing 10 is comprised of a bottom plate 10a provided below the printed circuit board 11 and a roughly box-shaped upper case 10b whose front and bottom sides are opened so as to surround the mechanism assembly 13. The bottom plate and upper case are formed of thin metal plates, and they are attached to the mechanism assembly 13 by means of screws or the like. Further, at the front portion of the casing 10, there is mounted a front panel 15 having an opening 15a.

As shown in FIG. 2, the printed circuit board 11 is provided with an interface connector for connection with a personal computer, various IC such as a microprocessor, memories and motor drivers and the like, and various electrical parts such as resistors, capacitors and switches and the like. With these elements, not only the optical pick-up but also a spindle motor, a loading motor and a sled motor described herein below are electronically controlled.

As shown in FIGS. 2 to 4, the mechanism assembly 13 housed in the casing 10 is provided with a chassis 40 which is preferably constructed from a hard resin. The chassis 40 is constructed from a bottom portion 40a having roughly rectangular-shaped aperture 41 and a U-shaped wall portion 40b which stands erect along the left, right and back edge portions of the bottom portion 40a.

In this way, no wall portion is formed in the front of the chassis 40 such that the front of the chassis is open. Further, when the mechanism assembly 13 is assembled into the casing 10, the open front portion of the chassis 40 is aligned with the aperture 15a of the front panel 15 attached to the casing 10 so that the disc tray 5 can be moved into and out of the main body 2 through the opening 15a.

As shown in FIGS. 1 and 2, the disc tray 5 is provided with a shallow concave disc supporting portion 5a. The optical disc 3 is placed in the disc supporting portion 5a of the disk tray 5, and then transported to a disc loaded position (disc playback position) under the condition that the optical disc 3 is placed in a prescribed position. Further, in the disc tray 5, there is formed a substantially rectangular shape opening 20 which extends from the roughly central portion of the disc tray toward the rear portion thereof such that a turntable described hereinbelow can be raised through this opening and an optical scanning can be carried out by the optical pick-up through this opening 20.

Figure 5:
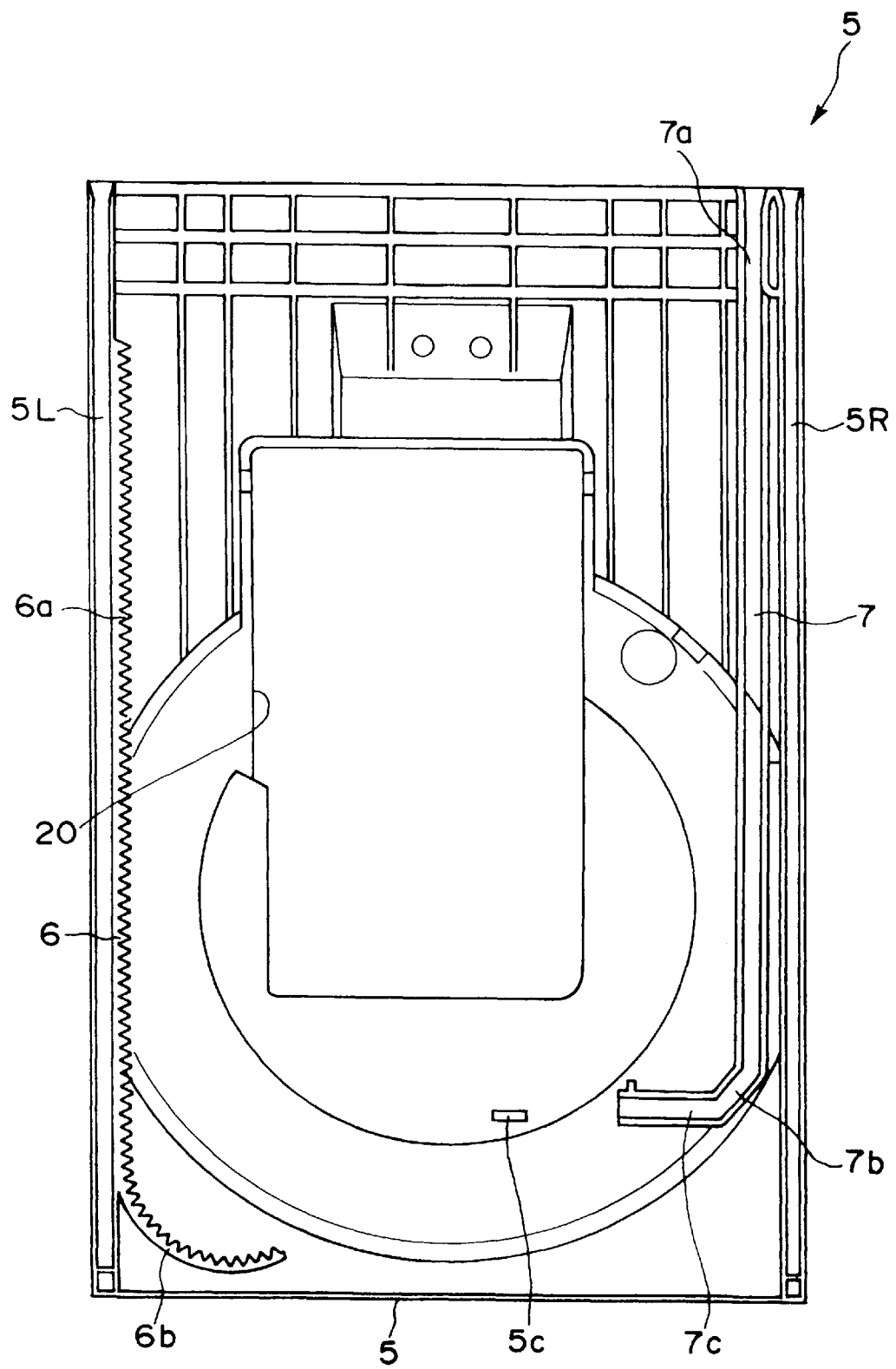
FIG. 5 is a bottom view of the construction of the underside of a disc tray of the disc drive shown in FIG. 1.

As shown in FIG. 5, on the left and right portions of the underside surface of the disc tray 5, there are formed guide grooves 5L, 5R so as to extend in a longitudinal direction of the disc tray 5. These guide grooves 5L and 5R are adapted to slidably engage with protruding guide members 40g (see FIGS. 3 and 4) formed on the left and right side portions of the bottom portion 40a of the chassis 40.

Further, the underside surface of the disc tray 5 is further provided with a rack gear 6 which includes a first rack 6a which extends in a straight line in the forward and backward direction along the guide groove 5L and a roughly 90 degree arc-shaped second rack 6b which is formed at the front end portion (the front side of the disc tray 5, as shown in the lower portion of FIG. 5) of the first rack 6a so as to be continuous therewith.

Furthermore, as shown in FIG. 5, a cam member movement restricting groove 7 is provided on the underside surface of the disk tray 5 along the guide groove 5R which is positioned at the opposite side of the first rack 6a. This cam member movement restricting groove 7 is constructed from a first movement restricting groove 7a which extends parallel to the first rack 6a, a second movement restricting groove 7b which slants at a roughly 45 degree angle with respect to the first movement restricting groove 7a, and a third movement restricting groove 7c which slants at a roughly 45 degree angle with respect to the second movement restricting groove 7b. Accordingly, the third movement restricting groove 7c is arranged at a roughly 90 degree angle with respect to the first movement restricting groove 7a.

In this regard, it is to be noted that a rib (protrusion) indicated by the reference numeral 5c in the drawing is a member that is adapted to engage with a disc tray locking portion 55d formed in a cam member 55 (described below) for restricting the horizontal movement (forward and backward direction) of the disc tray 5.

Further, as shown in FIGS. 2 to 4, the chassis 40 is provided with a mechanism unit 42 equipped with a turntable 46 for rotating the optical disc 3 and an optical pick-up 47 for playing back or recording and playing back the optical disc 3 and others.

The mechanism unit 42 is arranged inside a roughly rectangular-shaped opening 41 formed in the bottom portion 40a of the chassis 40, with the rear portion of the mechanism unit 42 being supported in a manner that makes it possible for such rear portion to pivot with respect to the chassis 40 in order to enable the front portion of the mechanism unit 42 to be displaced between a raised position (upper position; FIG. 4) in which the optical disc 3 is supported on the turntable 46 and a lowered position (lower position; FIG. 3) which is lower than the raised position.

In particular, as shown in FIGS. 2 to 4, the mechanism unit 42 includes a base frame 43 constructed preferably from a hard resin, and a support member 44 which is supported on the base frame 43 via elastic members (insulators) 441.

The base frame 43 is formed so as to have a roughly rectangular shape which includes a front portion and a rear portion. In more detail, the base frame 43 comprises a substantially rectangular outer frame 43a and a substantially rectangular inner frame 43b arranged inside the outer frame 43a. The inner frame 43b is one size smaller than the outer frame 43a so as to define a space therearound and its corner portions are formed into an arched shape, respectively. Further, between the outer and inner frames 43a, 43b there is formed a connecting portion 43c which connects these frames integrally at a position roughly the middle of their height. Furthermore, a plurality of reinforcing vertical ribs 43d are integrally formed on the connecting portion 43c through a predetermined spacing so as to connect the outer and inner frames integrally. With this result, the base frame 43 is constructed into a so called rudder frame in which the reinforcing vertical ribs 43d are formed on the connecting portion 43c through a prescribed spacing around the inner frame 43b.

This base frame 43 is formed by injection molding. In this case, if the base frame 43 is formed from a usual mold body made of a hard resin and having a certain thickness, there is a case that deformation would occur when it is cooled after injection molding. However, if the base frame 43 is formed in the form of the rudder frame described above, it is possible to avoid such deformation from occurring and this means that it becomes possible to provide a light base frame having a high strength by injection molding.

Formed on the left and right side portions of the rear side of the base frame 43 (the back portion of the main body 2) are protruding axles 431, 432 which act as pivotal axles to enable the mechanism unit 42 to pivot with respect to the chassis 40. These axles 431, 432 are inserted into respective axle holes 433, 434 formed in the opposite inner wall portions of the chassis 40 defining the opening 41. By supporting the rear portion of the mechanism unit 42 with the axles 431, 432 in this way, the front portion of the mechanism unit 42 is able to move with respect to the chassis 40 between the lowered position shown in FIG. 3 and the raised position shown in FIG. 4 when the mechanism unit 42 (base frame 43) is rotated around the axles 431, 432.

Figure 15:
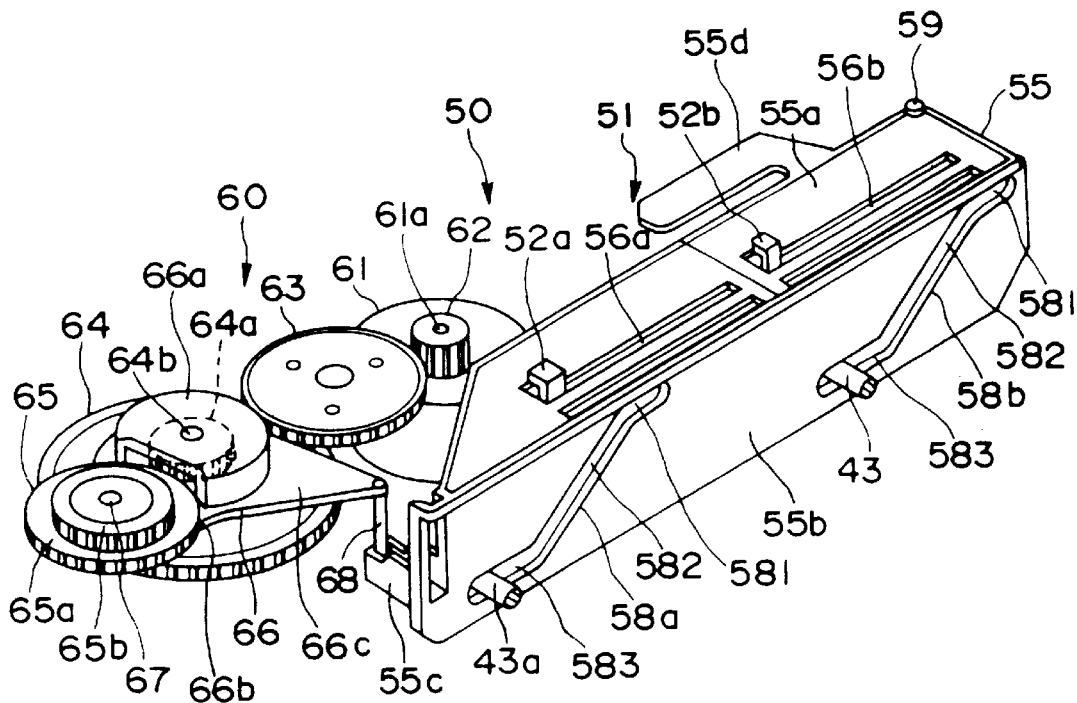
FIG. 15 is a perspective view which shows the structure of a cam mechanism used in the disc drive shown in FIG. 1, in which the cam member is shown in a first position.
Figure 16:
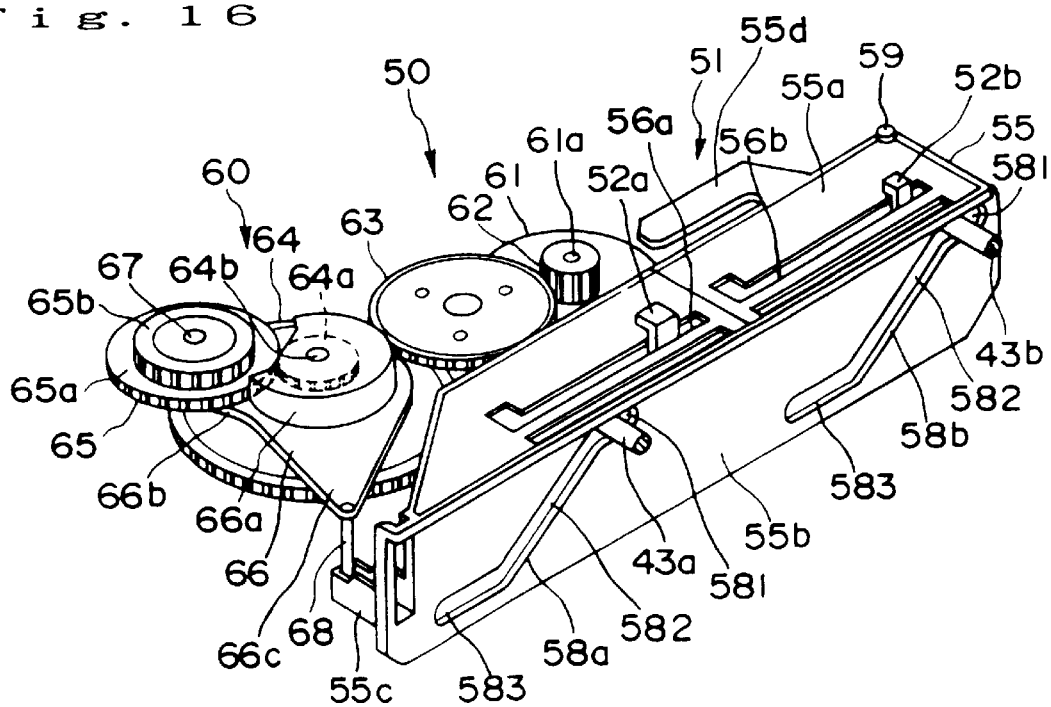
FIG. 16 is a perspective view which shows the structure of the cam mechanism used in the disc drive shown in FIG. 1, in which the cam member is shown in a second position.

Further, a pair of protruding guide pins 430a, 430b are formed on the front of the base frame 43 (See FIGS. 15 and 16). These guide pins 430a, 430b pass through respectively a pair of guide slots (not shown in the drawings) formed in the wall portion of the front portion of the chassis 40 which defines the opening 41, and then engage respectively with cam grooves 58a, 58b of the cam member 55 of the cam mechanism 51 described hereinbelow. This enables the front portion of the base frame 43 to be guided up or down in accordance with the displacement of the cam member 55.

Taking possible deformation (thermal deformation or the like) of the chassis 40 into account, a prescribed peripheral spacing 41G is provided between the base frame 43 and wall portions of the chassis 40. Specifically, this spacing 41G is provided around roughly the entire circumference of the base frame 43. In this way, the pivotal movement of the base frame 43 is not hindered even when the chassis 40 undergoes maximum distortion.

The support member 44 is constructed from a roughly rectangular-shaped bottom portion 44a and a wall portion 44b formed around the circumference of the bottom portion 44a. The wall portion 44b is one size smaller than the inner frame 43b of the base frame 43 such that the wall portion 44b is arranged inside the inner frame 43b of the base frame 43 via a prescribed spacing 43G. The support member 44 is supported by the base frame 43 via the elastic members (insulators) 441 provided on tabs 43T formed at the left and right corner portions of the front side of the inner frame 43b of the base frame 43 and on a tab 43T at roughly the middle of the rear portion of the inner frame 43b of the base frame 43. Namely, the support member 44 is supported by the base frame 43 via the elastic members 441 provided at three points which roughly form an isosceles triangle.

Figure 6:
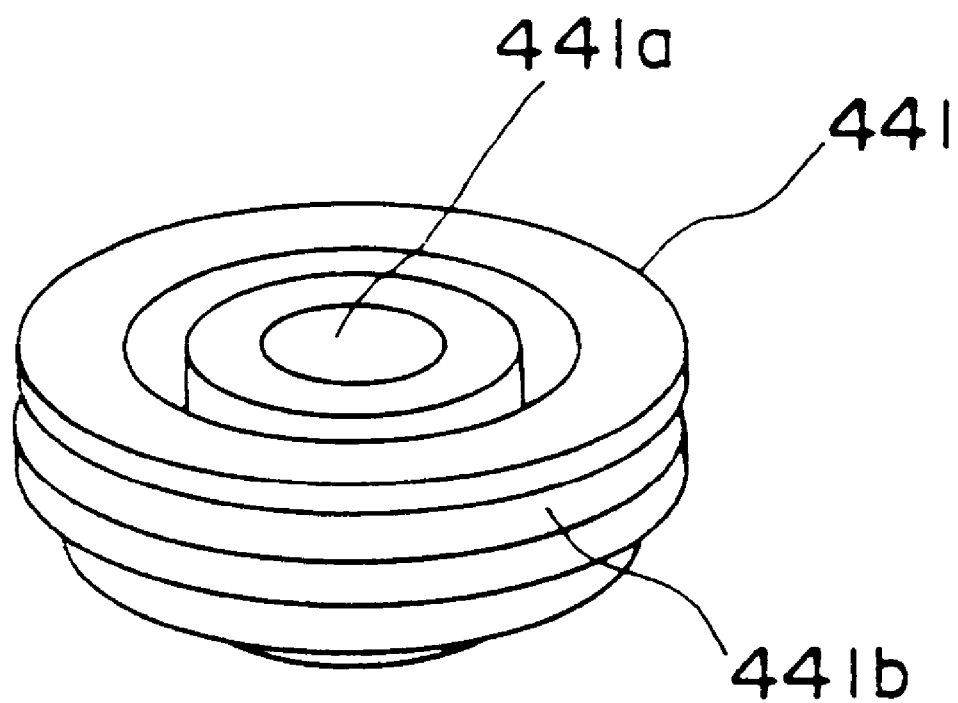
FIG. 6 is a perspective view showing the structure of an elastic member used in the disc drive shown in FIG. 1.

As shown in FIG. 6, each of the elastic members 441, which is formed from an elastic material such as rubber or the like, has a roughly cylindrical shape including a center hole 441a axially formed. On the outer circumferantial surface, there is formed a circumferential groove 441b. When the elastic members 441 are arranged in place to support the support member 44 on the base frame 43, the center hole 441a of each elastic member 441 fits onto an axis provided on the respective tabs 43T of the base frame 43 and then the groove 441b fits over a respective notched portion formed at the corresponding position of the support member 44. This construction serves to prevent vibration that is generated by rotation of the spindle motor described hereinbelow from being transmitted to the chassis 40. Further, this structure also serves to prevent vibration given from the outside of the optical disc drive from being transmitted to the chassis 40.

Further, as shown in FIGS. 2 to 4, the support member 44 is provided with a spindle motor (not shown in the drawings) for rotating an optical disc 3, a turntable 46 fixed to the rotation shaft 45a of the spindle motor, an optical pick-up 47, and an optical pick-up moving mechanism 48 for moving the optical pick-up 47 in the radial direction of the optical disc 3. The optical pick-up moving mechanism 48 is constructed in the form of a sliding feed mechanism.

The spindle motor is mounted to a motor support 45b which is made of a metal plate fixed to the support member 44. The spindle motor is capable of rotating the optical disc 3 at a high rotational speed, for example, capable of rotating the optical disc 3 at a speed of 180–3000 rpm. Further, a flat cable 45c is connected to the spindle motor for inputting and outputting control signals for the motor. As clearly shown in FIG. 2, this flat cable 45c extends through an opening 1a formed in the printed circuit board 11 and then the tip of the cable is connected to a prescribed connector 45d provided on the underside of the printed circuit board 11.

The turntable 46 is a disc-shaped member which includes a protruding ring-shaped center hub 46a formed in the center portion of the turntable 46. This center hub 46a is adapted to fit into a center hole 3a of the optical disc 3. The center hub 46a is formed so as to taper from the tip to the base in order to prevent the optical disc 3 from slipping off center when placed on the turntable 46. Further, inside the center hub 46a, there is provided a spring which allows the center hub 46a to be moved up and down. Furthermore, a ring-shaped permanent magnet 46b for creating an attraction force on a disc damper (described below) is provided in the turntable 46 at a position between the center hub 46a and the rotation shaft 45a of the spindle motor.

Further, a ring-shaped pad 46c is bonded to the upper part of the turntable 46 (i.e., the side used to support the optical disc 3) around the circumference of the center hub 46a. The pad 46c is made from an elastic material having a relatively high coefficient of friction so as to exhibit a function that prevents the optical disc 3 from slipping. Examples of such a material include various rubbers, soft resins or porous materials (sponges) or the like.

As described above, on the support member 44, there is provided the optical pick-up moving mechanism 48 constructed as a sliding feed mechanism. This optical pick-up moving mechanism 48 is provided for moving the optical pick-up 47 in the radial directions of the optical disc 3.

Figure 7:
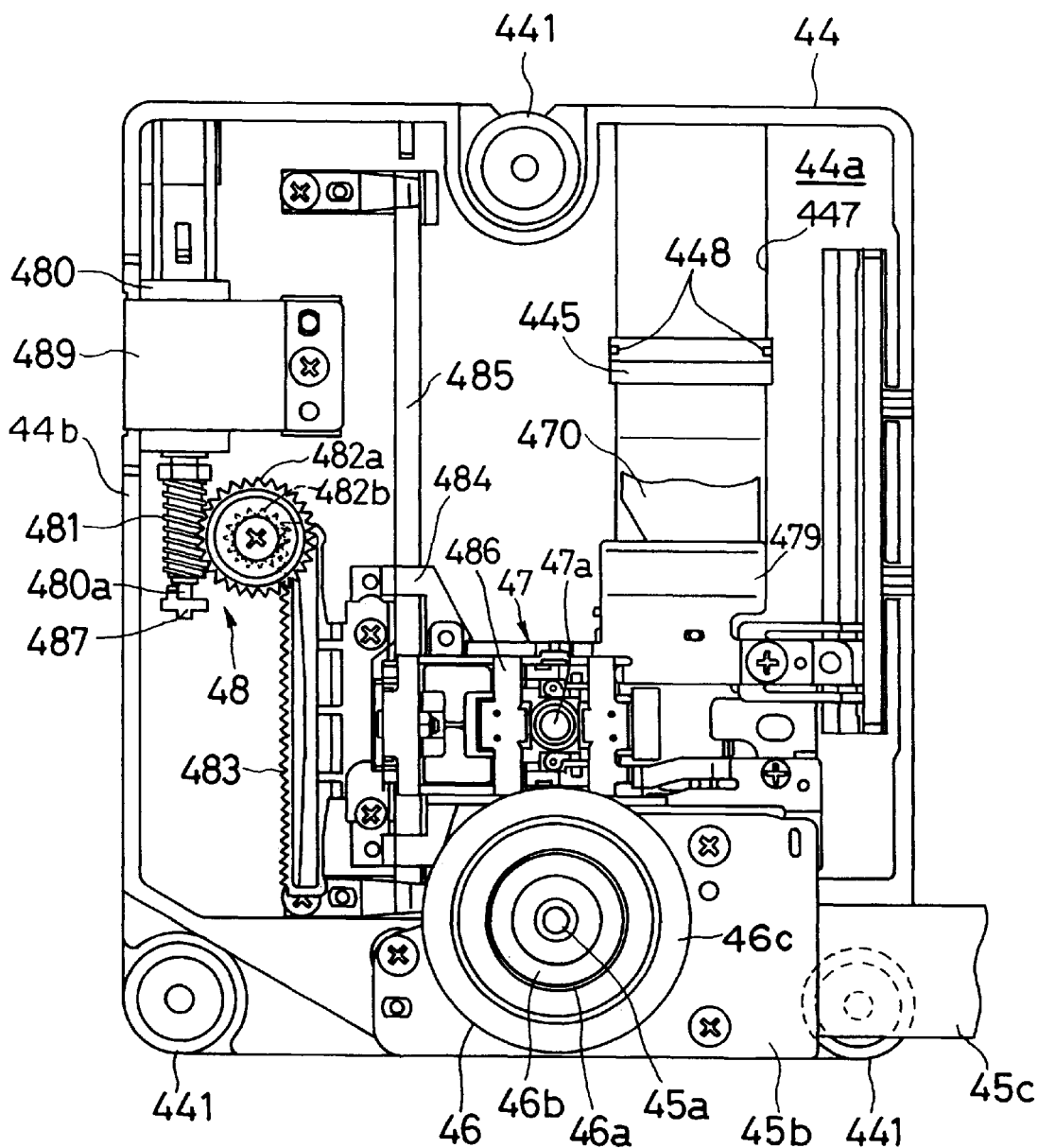
FIG. 7 is a planner view which shows a structure of an optical pick-up moving mechanism 48 of the disc drive shown in FIG. 1.

As illustrated in FIG. 7 in detail, the optical pick-up moving mechanism 48 is roughly constructed from a DC motor (sled motor) 480 capable of forward and reverse rotation, a worm (lead screw) 481 which is mounted to the rotational shaft 480a of the motor 480 and which is formed with a left-hand thread, a worm wheel 482a which meshes with the worm 481, a small-diameter pinion gear 482b which is co-axially formed with the underside surface of the worm wheel 482a, a rack gear 483 which meshes with the pinion gear 482b, a slider (driven means) 484 to which the rack gear 483 is mounted, a guide rod 485 for guiding the slider 484 and a base 486 which is integrally formed on the slider and on which the optical pick-up 47 is provided.

Each of the lead screw 481, the worm wheel 482a, the pinion gear 482b and the rack gear 483 are formed from a plastic material. As shown in FIG. 7, the rack gear 483 is formed into a structure in which the opposite ends thereof are supported by a substantially C-shaped arm so as to allow deformation toward the guide rod 485. Further, the lead screw 481 and the guide rod 485 are arranged so that their lengthwise directions are directed roughly parallel to the forward and backward direction of the optical disc drive 1.

A combination of the lead screw 481, the worm wheel 482a, the pinion gear 482b and the rack gear 483 constitutes a rotational speed reducing mechanism of the optical pick-up moving mechanism (sliding feed mechanism), so that the rotational motion of the sled motor 480 is transformed into a linear motion of the optical pick-up 47 with reducing the speed. In this way, by rotating the sled motor 480 in either of forward or reverse direction, it is possible to move the optical pick-up 47 in the radial direction of the optical disc 3.

Specifically, when the rotational shaft 480a of the sled motor 480 is rotated in the clockwise direction viewed from the tip side of the rotational shaft 480a, the worm wheel 482a is also rotated in the clockwise direction viewed from the upper side of the rotational axis thereof through the lead screw 481 having the left-hand thread, so that the rack gear 483 is fed forward (toward the turntable). As a result, the optical pick-up 47 is moved toward the inner side of the optical disc 3 from the outer side thereof. On the other hand, when the sled motor 480 is rotated in a reverse direction, the optical pick-up 47 is moved from the inner side to the outer side. In this connection, it is to be noted that the lead screw 481 and worm wheel 482a may be formed with a right-hand thread, respectively, and in this case the motion of the pick-up 47 described above is also reversed.

Meanwhile, the rotational shaft 480a of the sled motor 480 is provided with a small play in its axial direction in order to enable smooth rotation, so that the rotational shaft 480a can be slightly displaced within the play in the axial direction thereof. Therefore, when the rotational shaft 480a of the sled motor 480 is rotated in the anti-clockwise direction (which moves the optical pick-up 47 toward the outer side of the optical disc) viewed from the tip side of the rotational shaft, the rotational shaft 480a of the motor is pulled and slightly displaced toward the tip end thereof within the play due to the rotation of the lead screw 481.

In this embodiment, in order to minimize the axial displacement of the rotational shaft 480a of the motor 480 within the play which is caused by the rotation of the lead screw 481, there is provided a means 487 for restricting displacement of the rotational shaft (rotational shaft displacement restricting means). This rotational shaft displacement restricting means 487 is provided in front of the tip of the rotational shaft 480a so that the tip of the rotational shaft 480a is abutted thereto to restrict further axial displacement of the rotational shaft 480a when the rotational shaft 480a is axially displaced toward the tip side thereof.

Figure 8:
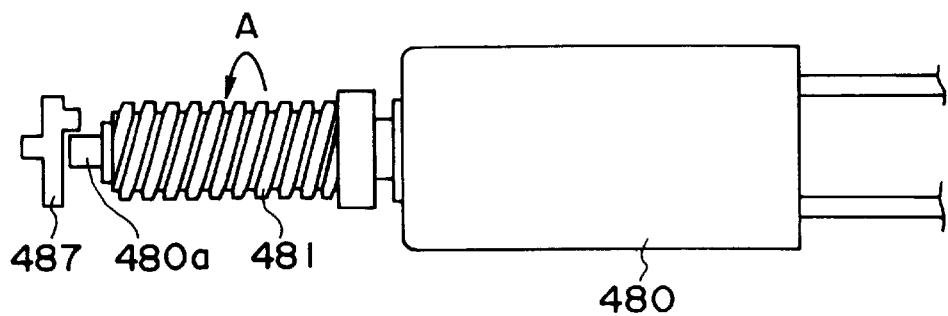
FIG. 8(a) is a planner view which shows a sled motor used in a sliding feed mechanism.
FIG. 8(b) is an enlarged view which shows the gap between the tip of the rotation axis of the sled motor and a stopper member.
Figure 8:
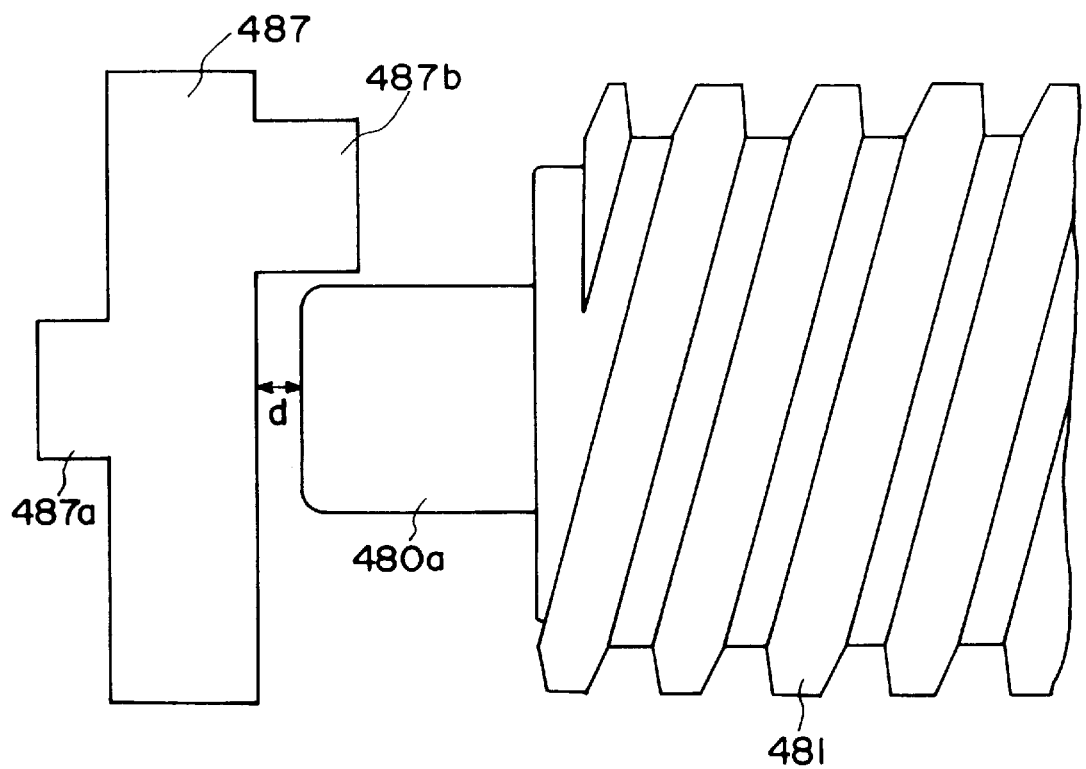

As clearly shown in FIG. 8(a) and FIG. 8(b), the rotational shaft displacement restricting means 487 is constructed from a stopper member 487 which is positioned through a prescribed distance "d" from the tip of the rotational shaft 480a under the condition that the rotational shaft 480a is shifted to the base side thereof within the play. This stopper member 487 is integrally formed with the bottom portion 44a of the support member 44 so as to protrude therefrom such that the tip of the rotational shaft 480a becomes abutted thereto when the rotational shaft 480a is displaced toward tip end due to the rotation of the lead screw 481.

For this purpose, the prescribed distance "d" is determined to be a size less than the play of the rotational shaft 480a. For example, in the case of a small-size motor such as one used in the optical pick-up moving mechanism of the CD-R drive, the prescribed distance "d" is set to lie within the range of about 0.02 mm to 0.05 mm.

Since the stopper member 487 is pushed when the tip of the rotational shaft 480a is abutted thereto, it is preferred that a reinforcing means is further provided to increase its strength. For example, as shown in FIG. 8(b) it is possible to form a reinforcing rib 487a on the rear surface (a surface which does not face the rotational shaft) of the stopper member 487 integrally. Further, it is also possible to form another reinforcing rib 487b on the front surface as shown in FIG. 8(b). This reinforcing rib 487b is provided at a position of the front surface where the rotational shaft 480a of the sled motor 480 is not abutted.

Figure 9:
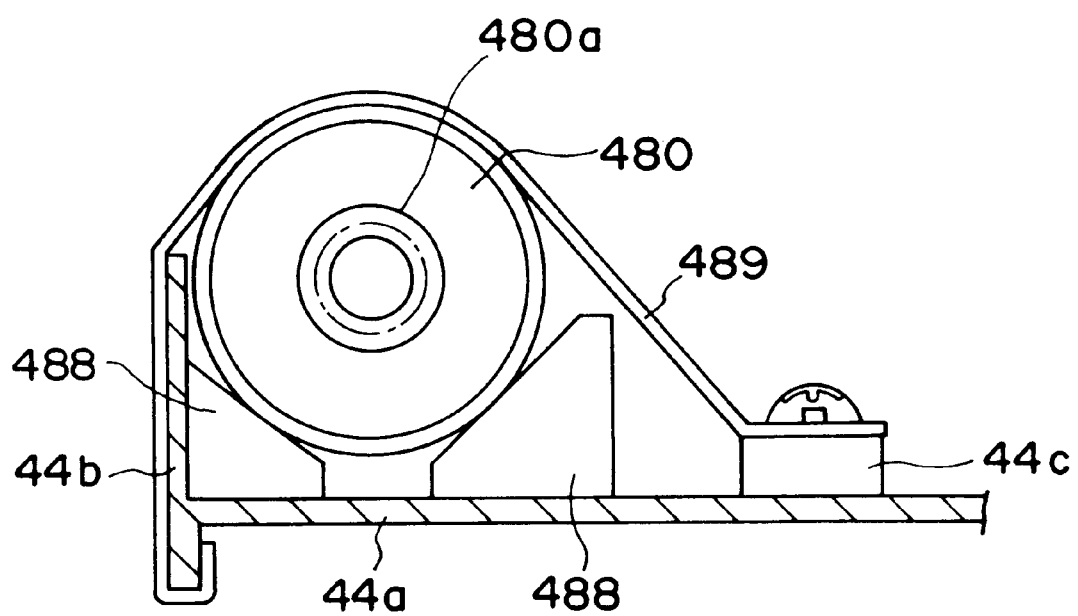
FIG. 9 is a front view which shows the mounting state of the sled motor.

As shown in FIG. 9, the sled motor 480 is placed on a pair of supporting members 488 which are integrally formed with the bottom portion 44a of the support member 44. Each of the supporting members is constructed from two pieces arranged so as to form a V-shaped supporting surface. Further, the sled motor 480 is mounted onto the supporting members 488 by holding the upper portion of the motor 480 with a retaining plate 489 which is formed from a metal plate or the like. Specifically, one end of the retaining plate 489 is bent along the side wall 44b, and its tip portion is formed into a C-shaped hook which is engaged with the lower edge of the side wall 44b. On the other hand, the other end of the retaining plate 489 is mounted onto a mounting portion 44c formed on the bottom portion 44a by means of a screw or the like.

When the sled motor 480 is to be mounted onto the supporting members 488, first the sled motor 480 is positioned onto the supporting members under the condition that a thin metal plate or the like having a prescribed thickness is interposed between the tip of the rotational shaft 480a of the sled motor 480 and the stopper member 487. As described above, the thickness of the metal plate is less than the play, for example 0.02 mm to 0.05 mm. Next, the sled motor 480 is secured onto the supporting members using the retaining plate 489 described above, and then the metal plate which has been interposed between the tip of the rotational shaft 480a and the stopper member 487 is removed therefrom. In this way, it is possible to precisely set the distance between the tip of the rotational shaft 480a and the stopper member 487 so as to be the prescribed distance "d".

Figure 10:
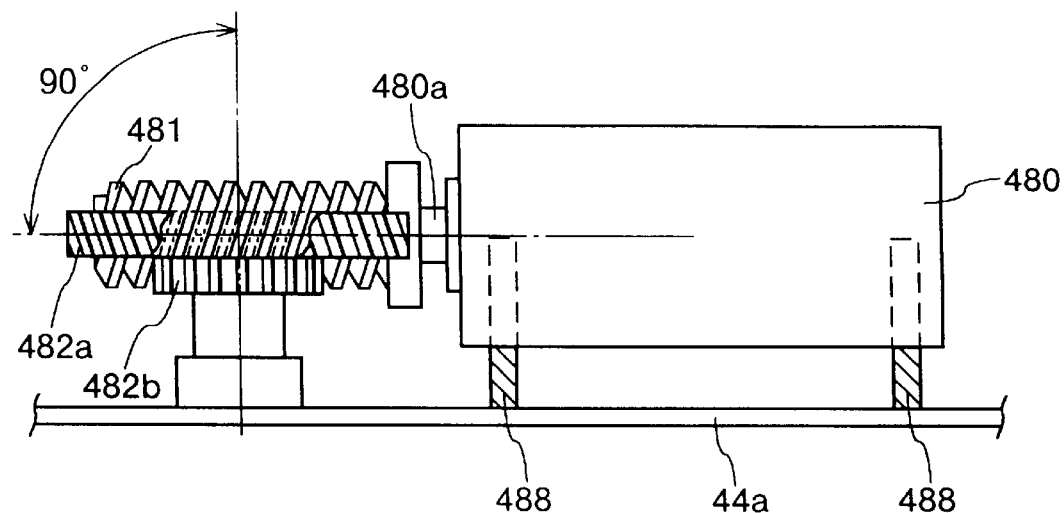
FIGS. 10(a), 10(b) and 10(c) respectively show engagement conditions between a lead screw and a warm wheel used in the sliding feed mechanism, respectively.
Figure 10:
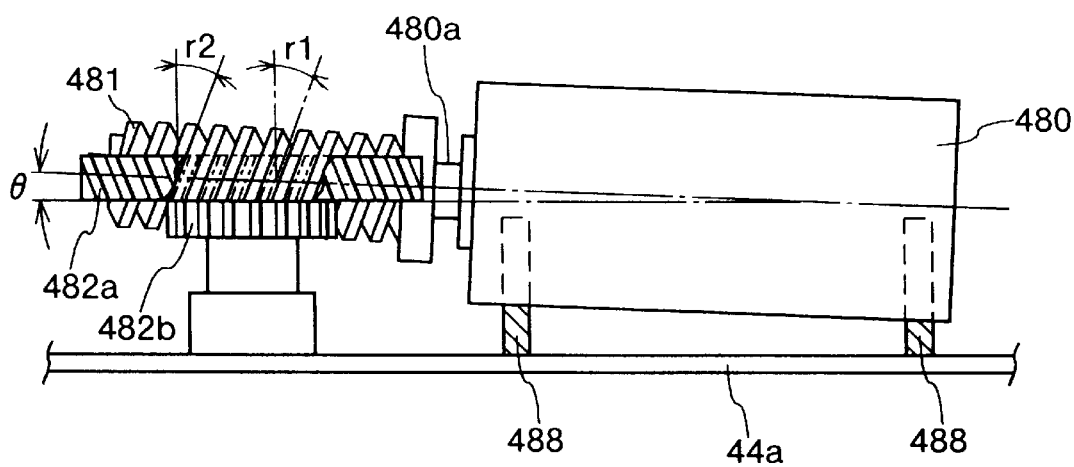
Figure 10:
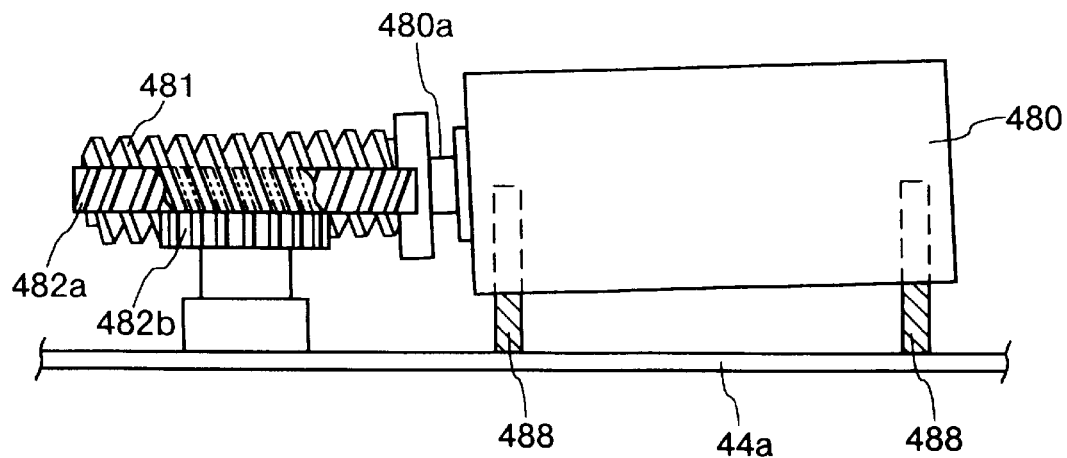

Further, as shown in FIG. 10(a), the lead screw 481 of the sled motor 480 and the worm wheel 482a are arranged in such a manner that their rotational axes are perpendicular to each other, in general. Moreover, in order to move the optical pick-up 47 properly in the radial direction of the optical disc 3 with a high accuracy, each of the lead screw 481 and the worm wheel 482a is formed so as to have teeth with a small module and a small lead angle. However, in a case where such lead screw 481 and worm wheel 482a are used, there is a case that the lead screw 481 is locked up or bitten with the worm wheel 482a due to meshing interference and thereby it is no longer possible to restore them their normal meshing state by reverse rotation of the motor.

Such a locking state between the lead screw 481 and the worm wheel 482a can be avoided by constructing the rack gear 483 so that it is elastically deformable toward the guide rod 485 as described above. Another approach is, as shown in FIG. 10(b), to construct a lead angle ($\gamma1$) of the worm wheel 482a to be larger than a lead angle ($\gamma2$) of the lead screw 481 of the sled motor 480 and then to mount the sled motor 480 so that the rotational shaft 480a of the sled motor 480 is tilted for an angle $\theta$ with respect to the horizon to achieve a proper meshing between the lead screw 481 of the sled motor 480 and the worm wheel 482a having the above described lead angle. In this regard, it is to be noted that the lead screw 481 is formed with a left-hand thread as described above.

By mounting the sled motor 480 with its rotational shaft 480a being tilted as described above with reference to FIG. 10(b), it becomes possible for the lead screw 481 to have an apparent lead angle which is larger than the lead angle of the lead screw 481 shown in FIG. 10(a) in spite of using the same lead screws 481. Further, the lead angle of the worm wheel 482a shown in FIG. 10(b) is larger than that of the worm wheel 482a shown in FIG. 10(a). This means that the lead angles of the lead screw 481 and worm wheel 482a become larger. In this way, it becomes possible to reduce slipping when the lead 481 is in mesh with the worm wheel 482a, thereby enabling to effectively prevent a locking state from occurring between the lead screw (worm) 481 and the worm wheel 482a with the simple construction.

Further, according to this arrangement shown in FIG. 10(b), since the lead screw 481 is the same as that used in the arrangement shown in FIG. 10(a) and the number of teeth of the worm wheel 482a is the same as that shown in FIG. 10(a), an amount of the movement of the optical pick-up 47 per one rotation of the rotational shaft 480a of the sled motor 480 is also the same as that shown in FIG. 10(a).

Furthermore, according to this arrangement, the rear portion of the sled motor 480 can be lowered as shown in FIG. 10(b), which creates a space above the rear portion of the sled motor 480, thus leading to expanding degree of freedom for design.

Although in the above a description is made with regard to an example where a left-hand thread is formed on the lead screw 481, the present invention is not limited to the example. It is also possible to use a lead screw 481 having a right-hand thread. In this case, the sled motor 480 is mounted so that the rotational shaft 480a of the sled motor 480 is tilted downwardly as shown in FIG. 10(c).

The optical pick-up 47 which is placed on the slider 484 can be moved in the radial direction of the optical disc 3 by means of the above described optical pick-up moving mechanism 48. This optical pick-up 47 is a flat type optical pick-up constructed so as to deflect light reflected from the optical disc 3 by roughly 90 degrees using a mirror (or prism) or the like to guide such light toward a light gathering element such as a photodiode or the like. Further, the optical pick-up 47 comprises an object lens 47a and an actuator (not shown in the drawings).

As shown in FIGS. 2, 3, 4 and 11, a flexible printed circuit 470 is connected to the optical pick-up 47 for outputting signals read out from the optical disc 3 and for outputting and inputting various controlling signals used for focusing servo and tracking servo and the like. In the flexible printed circuit 470, a plurality of conductors are arranged for supplying the above-mentioned various signals, so that it has a relatively large width. In this embodiment, the optical pick-up assembly is constructed from the optical pick-up 47 and flexible printed circuit 470.

Figure 11:
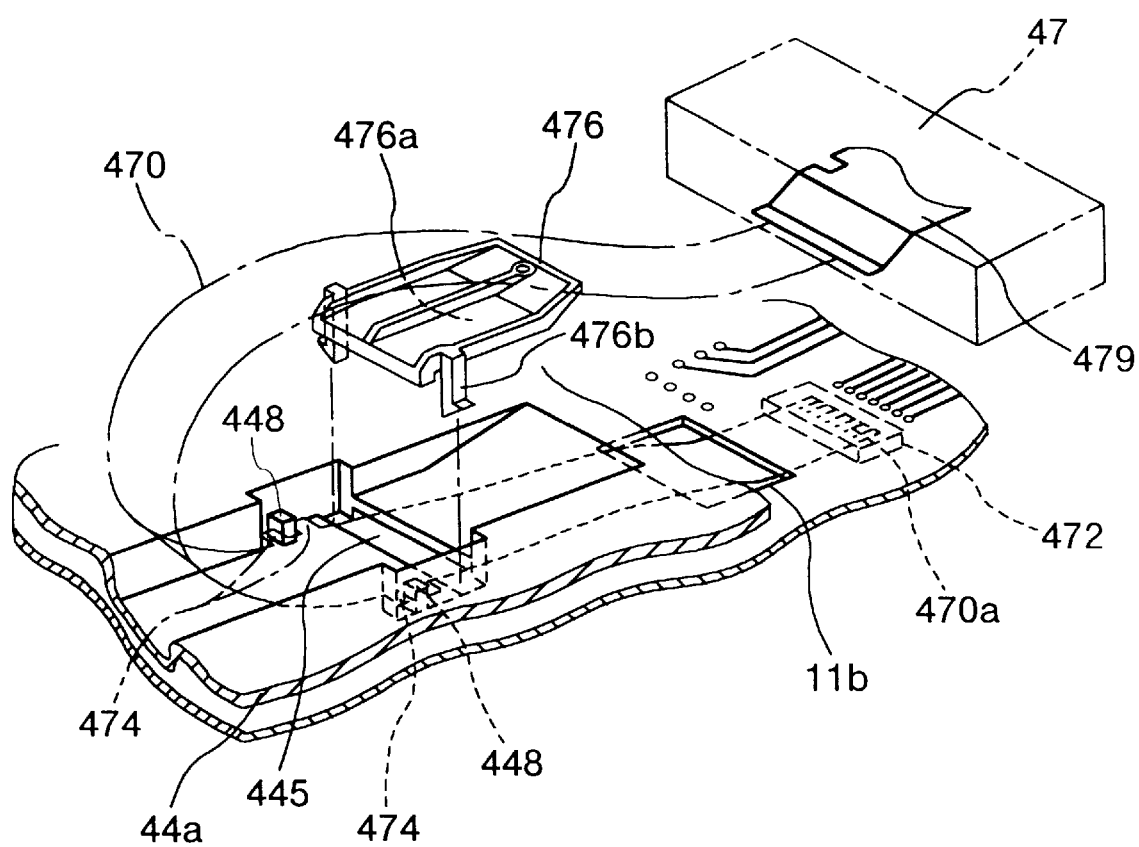
FIG. 11 is a perspective view which shows wiring condition of a flexible printed circuit according to the present invention.
Figure 12:
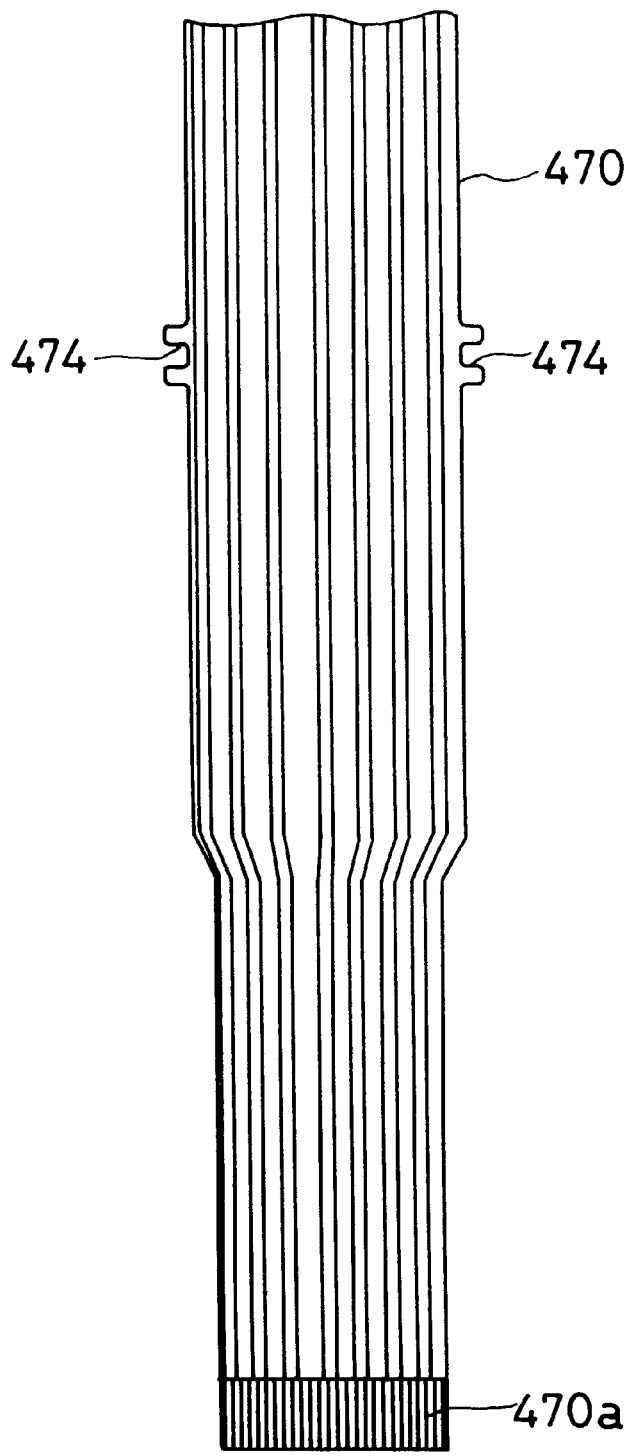
FIG. 12 is a planner view of the flexible printed circuit.

As shown in FIGS. 2, 11 and 12, at the tip end of the flexible printed circuit 470, there is formed a connecting terminal section 470a, and the flexible printed circuit 470 passes through an opening 445 formed in the bottom 44a of the support member 44 and then passes through an opening 11b formed in the printed circuit board 11, and then the connecting terminal section 470a is connected to a mating connector 472 provided on the underside surface of the printed circuit board 11.

Further, as shown in FIGS. 11 and 12, on the both edges of the roughly middle portion of the flexible printed circuit 470, a pair of engagement portions 474 are integrally formed with the flexible printed circuit 470. These engagement portions 474 are formed into a concave protrusion, respectively. As described above, these engagement portions 474 are positioned at a roughly middle portion of the flexible printed circuit 470 in its lengthwise direction such that a portion of the flexible printed circuit 470 between the middle portion and the optical pick-up 47 can have a desired curved form as shown in FIG. 11. By giving such a curved form to the portion of the flexible printed circuit 470, the flexible printed circuit 470 can follow the movement of the optical pick-up 47 without giving any load to the optical pick-up 47 when it is being moved. Further, since the portion of the optical pick-up 47 merely repeats a predetermined deformation according to the movement of the optical pick-up 47, there is no risk that the flexible printed circuit 470 contacts the signal surface of the optical disc 3 and it is caught by surrounding parts.

In this regard, it is to be noted that the number and the shape of the engagement portions 474 are not limited to the example described above. For example, two or more engagement portions can be formed on one of the edges of the printed flexible circuit 470, and they can be formed into a rectangular tab or other shape. Further, they may be formed from separate parts and then they are fixedly attached to the flexible printed circuit 470.

As shown in FIGS. 7 and 11, the opening 445 of the support member 44 through which the flexible printed circuit 470 extends is formed in a concave portion 447 provided in the bottom portion 44a of the support member 44. This opening 445 is formed into an elongated slit having a width slightly larger than the width of the flexible printed circuit 470. In the vicinity of the opening 445 on the side opposite to the optical pick-up 47, there are provided a pair of protrusions 448 which are integrally formed on left and right walls defining the concave portion 447, as shown in FIGS. 7 and 11. The engagement portions 474 formed on the left and right edges of the flexible printed circuit 470 are in engagement with these protrusions 448, respectively.

Figure 13:
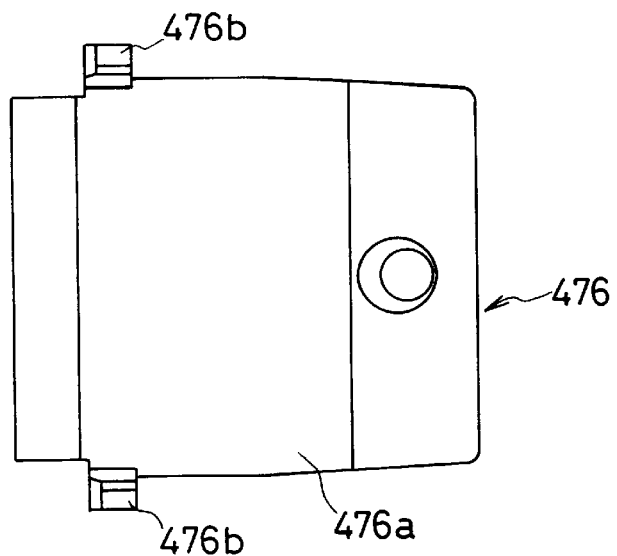
FIGS. 13(a), 13(b) and 13(c) are respectively a planner view, a side view and a bottom view of an opening closure member.
Figure 13:
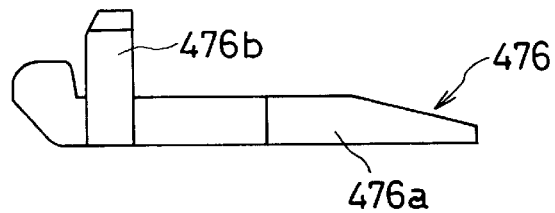
Figure 13:
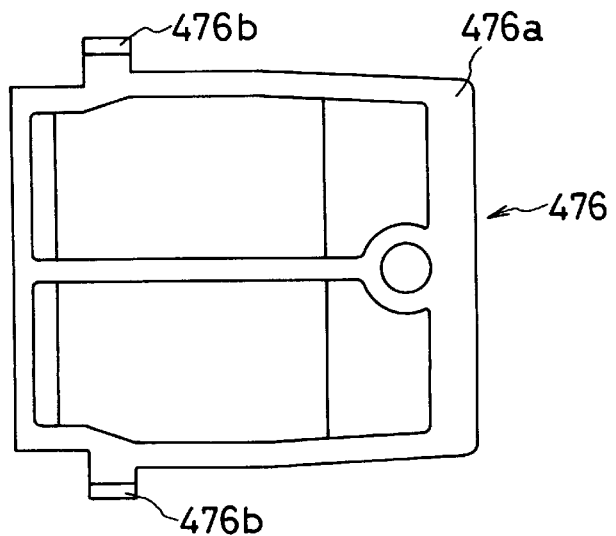

Further, an opening closure member 476 shown in FIG. 2 and FIG. 11 is removably attached to the opening 445. As shown in FIGS. 13(a), 13(b) and 13(c), the opening closure member 476 is generally constructed from a plate-like member 476a which is fitted onto the concave portion 447 of the bottom portion 44a of the support member 44 and a pair of leg portions 476b which are integrally formed with the plate-like member 476a so as to protrude downwardly from the left and right edges of the plate-like member 476a. These leg members 476b are elastically deformable to the direction that they approach to each other. Further, on the tip portion of each leg, there is formed an engagement hook.

In use, first, the left and right engagement portions 474 of the flexible printed circuit 470 which passes through the opening 445 are engaged with the left and right protrusions 448 formed on the walls defining the concave portion 447, and in this state the leg members 476b of the opening closure member 476 are inserted into the opening 445 from the both sides of the flexible printed circuit 470, thereby the opening closure member 476 can be removably attached to the opening 445.

As a result, the flexible printed circuit 470 is accurately positioned in its lengthwise direction with respect to the chassis (support member 44) due to the engagement between the engagement portions 474 and the protrusions 484. Accordingly, even if the pick-up 47 is moved, the flexible printed circuit 470 does not move in its lengthwise direction, thereby enabling to maintain the curved form shown in FIG. 11 and FIGS. 14(a) and 14(b). Further, when the flexible printed circuit 470 is pulled by the motion of the pick-up 47 toward the inner side of the optical disc 3, such a pulling force is not transmitted to the printed circuit board 11, thereby enabling to prevent the connecting terminal section 470a is disconnected from the connector 472. Furthermore, since the opening 445 is being closed by the plate-like member 476a of the opening closure member 476, it is possible to prevent dust or dirt from entering in to the space above the chassis 40 in which the pick-up 47 and the like are provided from the side of the printed circuit board 11 through the opening 445 due to a sucking force created by the high speed rotation of the optical disc 3.

Furthermore, at a portion of the optical pick-up 47 where the flexible printed circuit 470 is connected to the pick-up 47, there is provided a regulating member 479 which regulates an extending direction of the flexible printed circuit 470 from the optical pick-up 47 so as to give a predetermined curved form to the flexible printed circuit 470. This regulating member 479 is formed of a metallic plate having a width slightly larger than the width of the flexible printed circuit 470. In more detail, the regulating member 479 has a flat plate portion mounted onto the upper surface of the optical pick-up 47 and a slanting plate portion extending slantingly and downwardly from the flat plate, and the tip portion of the slanting plate portion is bent horizontally.

In this arrangement, since the flexible printed circuit 470 is held by the regulating member 479 from the upper side thereof, the flexible printed circuit 470 extends from the connecting portion with the optical pick-up 47 slantingly and then it is held by the tip portion of the regulating member 479. In this way, even if the optical pick-up 47 moves from the inner side of the optical disc 3 shown in FIG. 14(*a*) to the outer side thereof shown in FIG. 14(*b*), the flexible printed circuit 470 can maintain its ideal curved form, thereby enabling to prevent the flexible printed circuit 470 from contacting the signal surface of the optical disc 3. Further, a load exerted on the flexible printed circuit 470 by the movement of the optical pick-up 47 is relieved by the regulating member 479, so that the load exerted on the flexible printed circuit 470 does not affect the connecting portion between the flexible printed circuit 470 and the optical pick-up 47 directly.

In this embodiment, the sled motor 480 of the optical pick-up moving mechanism 48 is controlled by a controlling means (CPU) provided on the printed circuit board 11 together with the spindle motor and the loading motor 61 described hereinafter in detail.

In this case, in order to drive the sled motor 480 with a small voltage at the start of the rotation, it is preferred that the sled motor 480 is controlled such that its rotational shaft 480*a* is being slightly oscillated by applying pulses to the coil in a predetermined interval. In this way, it is not necessary to apply a large voltage to the motor at the start of the rotation. This is particularly suited for the case where a fine feed of the pick-up 47 is required during writing or reading operation being carried out. In the case of the small-size motor like the sled motor used in the optical pick-up moving mechanism of the CD-R drive, a pulse voltage of 40 Hz can be applied, for example.

As shown in FIG. 3 and FIG. 4, in front of the mechanism unit 42, there is provided a loading mechanism 50 for displacing the mechanism unit 42 between the lowered position (FIG. 3) and the raised position (FIG. 4) and for moving the disc tray 5 between the loading position and the eject position. This loading mechanism 50 comprises a cam mechanism 51 which is operatively coupled with the mechanism unit 42 and can be moved between a first position (FIG. 3) and a second position (FIG. 4) and a driving mechanism 60 for driving the disc tray 5 and the cam mechanism 51.

The cam mechanism 51 can be operated to move the mechanism unit 42 to either the lowered position when the cam mechanism 51 is in the first position shown in FIG. 3, or the raised position when the cam mechanism 51 is in the second position shown in FIG. 4. In more details, as shown in FIG. 15 and FIG. 16, the cam mechanism 51 includes a cam member 55 arranged so as to be slidable between a first position (FIG. 15) and a second position (FIG. 16) in the sideways direction with respect to the chassis 40 (i.e., the direction orthogonal to the direction of movement of the disc tray 5). The cam member 55 is generally constructed from a roughly plate-shaped horizontal portion 55*a* and a plate-shaped vertical portion 55*b* which is integrally formed on the underside surface of the horizontal portion 55*a* at a position close to the rear edge (at the side of the mechanism unit) so as to be perpendicular to the horizontal portion. That is, the cam member 55 is formed from a member having a roughly T-shaped cross section. This structure can prevent camber from being produced upon cooling process in the injection molding of resin materials.

Formed on the horizontal portion 55*a* of the cam member 55 are sideways guide grooves 56*a*, 56*b* which engage respectively with a pair of protrusions 52*a*, 52*b* which protrude from the top of the front portion of the chassis 40. These guide grooves 56*a*, 56*b* are used to guide the cam member 55 between the first and second positions. Further, the underside surface of the horizontal portion 55*a* is provided with an engaging pin (not shown) which is inserted into an elongated slot formed in the top of the front portion of the chassis 40. This engaging pin is adapted to interlock with an emergency eject mechanism 90 (described below).

Further, on the horizontal portion 55*a* of the cam member 55, there is formed a disc tray locking portion 55*d* which is engaged with the rib 5*c* formed on the rear surface of the disc tray 5 when the cam member 55 is displaced from the first position to the second position to restrict the movement of the disc tray 5.

The vertical portion 55*b* of the cam member 55 is positioned to face the front wall which defines the opening 41 of the chassis 40. Formed in the vertical portion 55*b* are a pair of cam grooves 58*a*, 58*b* each having the same shape. Each of the cam grooves 58*a*, 58*b* is constructed from a horizontally extending upper and lower grooves 581, 583 and a slanting groove 582 which connects the upper groove 581 and lower groove 583.

Further, the guide pins (following members) 430*a*, 430*b* which are provided on the front surface of the base frame 43 of the mechanism unit 42 as described above are inserted into the cam grooves 58*a*, 58*b*, respectively. In this way, when the cam member 55 is moved between the first position and the second position, the guide pins 430*a*, 430*b* are slidably moved along the cam grooves 58*a*, 58*b* in the up and down direction.

Namely, when the cam member 55 is positioned at the first position, the guide pins 430*a*, 430*b* are engaged with the lower grooves 583 (FIG. 15), and the front portion of the mechanism unit 42 is in the lowered position shown in FIG. 3. When the cam member 55 is moved from the first position to the second position, the guide pins 430*a*, 430*b* are moved up by the slanting grooves 582, thereby causing the front portion of the mechanism unit 42 to move from the lowered position toward the raised position. Then, when the cam member 55 reaches the second position, the guide pins 430*a*, 430*b* engage with the upper grooves 581 (FIG. 16), and the front portion of the mechanism unit 42 is displaced to the raised position shown in FIG. 4.

Further, a protrusion 59 is integrally formed on an end portion of the horizontal portion 55*a* of the cam member 55 to engage with the cam member movement restricting groove 7 formed in the underside surface of the disc tray 5. As a result, when the protrusion 59 is engaged with the first movement restricting groove 7*a* of the disc tray 5, the cam member 55 is prevented from moving in the sideways direction, whereby the cam member 55 is held at the first position. Then, in accordance with the movement of the disc tray 5 toward the playback position, the protrusion 59 slides from the first movement restricting groove 7*a* to the second movement restricting groove 7*b*, and upon moving through the slanting groove of the second movement restricting groove 7*b*, the cam member 55 is caused to displace within the range of the lower grooves 583 of the cam grooves 58*a*, 58*b* of the cam member 55. Then, when the protrusion 59 reaches the position of the third movement restricting groove 7*c*, the cam member 55 is allowed to move toward the second position.

In this connection, it is to be noted that when the cam member 55 is displaced to the second position, the disc tray locking portion 55*d* formed on the horizontal portion 55*a* of the cam member 55 is engaged with the rib 5*c* formed on the underside surface of the disc tray 5 as described above, thereby the disc tray 5 is restricted to move further, that is the disc tray 5 being locked up.

As shown in FIG. 15 and FIG. 16, the drive mechanism 60 of the loading mechanism 50 comprises a loading motor (DC motor) 61 capable of forward/reverse rotation provided on the underside surface of the front portion of the chassis 40, a pinion gear 62 mounted to a rotation axis 61*a* of the loading motor 61, a medium-diameter second gear 63 which meshes with the pinion gear 62, and a large-diameter third gear 64 which meshes with a small gear (not shown in the drawings) fixed coaxially below the second gear 63. Further, a small-diameter cylindrical portion is integrally formed on top of the third gear 64 so as to be coaxial therewith, with a small gear 64*a* being integrally formed on top of this cylindrical portion so as to be coaxially therewith. Meshing with the small gear 64*a* of the third gear 64 is an operative gear 65 which also meshes with the first and second racks 6*a*, 6*b* of the disc tray 5. Namely, the operative gear 65 is constructed from a lower gear 65*a* which meshes with the small gear 64*a* of the third gear 64, and an upper gear 65*b* which meshes with the rack 6 of the disc tray 5, in which the upper gear 65*b* being integrally formed on the same axis as the lower gear 65*a*.

In this embodiment, the gears 62–65 are flat teeth gears, and a combination thereof constitutes a rotational speed reduction mechanism for the loading motor 61 in the loading mechanism 50.

The operative gear 65 is rotatablly mounted to a rotation axis 67 provided on a planetary arm 66, and this planetary arm 66 is rotatably mounted to a rotation axis 64*b* of the third gear 64. The planetary arm 66 includes a rotation portion 66*a* which is rotatably fitted onto the cylindrical portion of the third gear 64, and first and second arms 66*b*, 66*c* which extend from the rotation portion 66*a*, so that the whole of the planetary arm 66 has a roughly v-shaped structure.

One end of the first arm 66*b* of the planetary arm 66 is provided with the protruding rotation axis 67 described above to which the operative gear 65 is rotatably mounted. Namely, the operative gear 65 rotates about the axis 67 of the first arm 66*b* which is served as a rotation axis thereof while the operative gear 65 also turns around the axis 64*b* which is served as a revolution axis, so that the operative gear 65 functions as a planetary gear which can be turned around the axis 64*b* along the second rack 6*b* with being rotated about the axis 67. In this planetary gear mechanism, the operative gear 65 acts as a planet gear and the small gear 64*a* of the third gear 64 acts as a sun gear. Further, the end of the second arm 66*c* of the planetary arm 66 is provided with a pin 68 which protrudes downward, and the tip portion of this pin 68 is fitted into an engaging portion 55*c* formed in the cam member 55.

In this connection, as shown in FIG. 15 and FIG. 16, one part of the rotation portion 66*a* of the planetary arm 66 is partially cut away to expose the small gear 64*a* of the third gear 64 in order to enable the lower gear 65*a* of the operative gear 65 to mesh with the small gear 64*a* of the third gear 64.

In this structure, the operative gear 65 carries out a first operation when engaged with the first rack 6*a* of the disc tray 5, in which the disc tray 5 is moved between the disc eject position and the disc loaded position with the operative gear 65 being held at a prescribed position, and a second operation when engaged with the second rack 6*b* of the disc tray 5, in which the cam member 55 is moved between the first position and the second position by the revolution of the operative gear 65.

Specifically, while the protrusion 59 provided on the top of the horizontal portion 55*a* of the cam member 55 is in engagement with the first movement restricting groove 7*a* in the underside surface of the disc tray 5, the movement of the cam member 55 from the first position to the second position is restricted. Accordingly, during such time, in other words during the time that the disc tray 5 is moving between the eject position and the loaded position, the pin 68 of the second arm 66*c* of the planetary arm 66 is engaged with the engaging portion 55*c* of the cam member 55, thereby making it impossible for the planetary arm 66 to be turned around the axis 64*b*. As a result, the operative gear 65 is being held at a prescribed position while the protrusion 59 of the cam member 55 is engaged with the first movement restricting groove 7*a* of the disc tray 5. In this state, as shown by the dashed line in FIG. 3, the operative gear 65 engages with the first linear rack 6*a* of the disc tray 5, whereby the disc tray 5 is moved from the disc eject position to the disc loaded position according to the rotation of the operative gear 65 caused by the rotation of the loading motor 61, and in this way the operative gear 65 functions as a driving gear for moving the disc tray 5.

On the other hand, when the disc tray 5 moves accordingly to a position just before the disc loaded position, the protrusion 59 of the cam member 55 moves from the first movement restricting groove 7*a* to the second movement restricting groove 7*b* of the disc tray 5, and this causes the cam member 55 to be displaced in the sideways direction (toward the second position) by a small amount. When the disc tray 5 moves further, the protrusion 59 reaches the third movement restricting groove 7*c*, whereby the cam member 55 is allowed to move from the first position to the second position. In this state, as shown by the dashed line in FIG. 4, since the operative gear 65 is engaged with the arc-shaped second rack 6*b* and the cam member 55 is able to move to the second position and therefore the planetary arm 66 can be turned around the axis 64*b*, the operative gear 65 moves along the arc-shaped second rack 6*b* in accordance with the rotation of the loading motor 61. Namely, the operative gear 65 acts as a planetary gear.

In accordance with such a turning movement of the operative gear 65, the planetary arm 66 rotates clockwise around the common axis (revolution axis) 64*b* from the position shown in FIG. 15 to the position shown in FIG. 16, which in turn causes the second arm 66*c* of the planetary arm 66 to rotate in the same direction. In accordance with this rotation of the second arm 66*c*, the cam member 55 is driven by means of the pin 68 coupled with the engaging portion 55*c*, and thereby the cam member 55 moves from the first position shown in FIG. 15 toward the second position shown in FIG. 16. In accordance with this movement of the cam member 55 from the first position toward the second position, the front guide pins 430*a*, 430*b* of the base frame 43 of the mechanism unit 42 rise up along the slanting grooves 582, 582, whereby the front portion of the mechanism unit 42 is also displaced from the lowered position shown in FIG. 3 to the raised position shown in FIG. 4.

Figure 17:
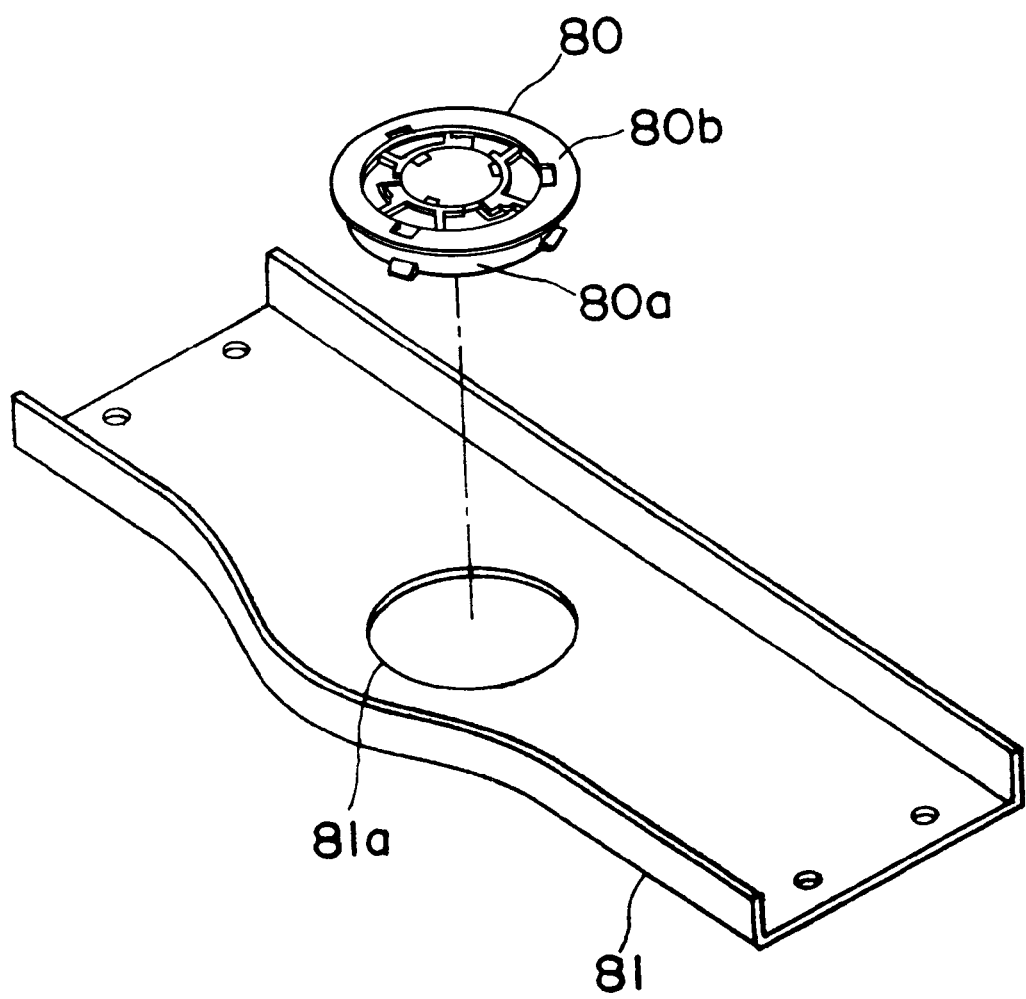
FIG. 17 is a perspective view which shows the structure of a disc clamper used in the disc drive shown in FIG. 1.

Further, a disc damper 80 is provided on the upper portion of the chassis 40. As shown in FIG. 17, the disc damper 80 is rotatably supported by a plate-shaped support member 81 having a central opening 81a.

In more detail, the support member 81 is mounted onto the chassis 40 in the side-ways direction by being fastened at both ends with bosses (or rivets) to mounting portions 40c of the chassis 40. On the other hand, the disc damper 80 is formed from a flat drum-shaped main body 80a having a bottom portion adapted to be inserted into the opening 81a of the support member 81, and a flange portion 80b which is formed around the upper circumferential portion of the main body 80a. The flange portion 80b is adapted to abut the top of the support member 81. Further, an annular steel attraction member is provided inside the main body 80a such that it is pulled by the permanent magnet 46b provided in the turntable 46.

Further, indicated by the reference numeral 90 in FIG. 2 to FIG. 4 is an emergency eject mechanism for the disc tray 5. This emergency eject mechanism 90 is provided for ejecting an optical disc 3 placed on the disc tray 5 in case the loading motor 61 is disabled to operate due to a power outage or the like while the optical disc 3 is being rotated for playback. Namely, in this emergency eject mechanism 90, a jig is inserted into the main body 2 from the outside to forcedly displace the cam member 55 from the second position to the first position to push out a tip portion of the disc tray 5 from the main body 2, and then the disc tray 5 is manually moved forward to eject the optical disc 3.

Next, a description of the operation of the disc drive 1 will be given below.

When the disc drive 1 is not in use, the empty disc tray 5 is housed inside the casing 10 (inside the main body 2), that is the disc tray 5 is in the disc loaded position (disc play back position). In this state, as shown in FIG. 4, the mechanism unit 42 is in the raised position, the cam member 55 is in the second position, and the protrusion 59 of the horizontal portion 55a of the cam member 55 is in the third movement restriction groove 7c. Further, as shown by the dashed lines in FIG. 4, the operative gear 65 of the drive mechanism 60 is in engagement with an end portion of the second rack 6b which is far away from the first rack 6a.

Now, if an eject operation is carried out, the loading motor 61 will rotate in a prescribed direction, whereby the operative gear 65 is caused to rotate in the clockwise direction shown in FIG. 4 through the rotational speed reduction mechanism. In this state, the operative gear 65 acts as a planetary gear which can be turned around the revolution axis 64b, and in accordance with this revolution, the operative gear 65 moves along the second rack 6b toward the first rack 6a. In accordance with the revolution of the operative gear 65, the planetary arm 66 rotates in the counterclockwise direction about the revolution axis (common axis) 64b. In accordance with the rotation of the planetary arm 66, the second arm 66c causes the cam member 55 to move, via the pin 68, from the second position shown in FIG. 4 (FIG. 16) to the first position shown in FIG. 3 (FIG. 15), whereby the mechanism unit 42 is also moved from the raised position to the lowered position. In this case, while the cam member 55 is moving from the second position to the first position, the protrusion 59 on top of the horizontal portion 55a of the cam member 55 slides along the third movement restricting groove 7c, and reaches the first movement restricting groove 7a via the second movement restricting groove 7b.

At that point, the operative gear 65 moves from the arc-shaped second rack 6b to the linear first rack 6a, and the protrusion 59 of the cam member 55 also moves from the second movement restricting groove 7b to the first movement restricting groove 7a. When the protrusion 59 of the cam member 55 is moved to the first movement restriction groove 7a, the cam member 55 is restricted from moving in the sideways direction, so that the rotation of the planetary arm 66 is also restricted. In this state, the operative gear 65 acts as a driving gear to drive the disc tray 5 with being held at that position. As a result, as shown by the dashed line in FIG. 3, the operative gear 65 engages with the first rack 6a of the disc tray 5, whereby the disc tray 5 is moved from the loaded position to the eject position according to the rotation of the motor 61. In this state, the mechanism unit 42 has been displaced to the lowered position at a prescribed spacing from the disc clamper 80. Accordingly, the disc clamper 80 and the turntable 46 do not hinder the eject operation of the disc tray 5.

Now, if a loading operation is carried out by placing the optical disc 3 into the disc supporting portion 5a of the disc tray 5 which has been ejected to the outside through the aperture 15a of the front panel 15, the loading motor 61 will rotate in the reverse direction (i.e., the direction opposite to the direction described above), thereby causing the operative gear 65 to rotate, via the rotational speed reduction mechanism, in the counterclockwise direction (i.e., reverse direction) shown in FIG. 3. Accordingly, the disc tray 5 moves backward (toward the rear of the disc drive) through the aperture 15a to the disc loaded position. In this way, the optical disc 3, which is supported at a prescribed position on top of the disc tray 5, is also transported to the disc loaded position (disc playback position) inside the main body 2.

During the loading operation of the disc tray 5, namely while the disc tray 5 is moving backward, the operative gear 65 engages with the first rack 6a on the underside surface of the disc tray 5, and the protrusion 59 of the cam member 55 is guided along the first movement restriction groove 7a. Accordingly, the cam member 55 is held at the first position, and is therefore unable to move to the second position. Consequently, the planetary arm 66 is held at a prescribed position so as to be unable to rotate. In this state, the operative gear 65 is rotating at that position, so that it acts as a driving gear for driving the disc tray 5. Further, in this state, the front portion of the mechanism unit 42 is held at the lower position.

When the disc tray 5 approaches the disc loaded position, the protrusion 59 formed on the cam member 55 moves from the first movement restriction groove 7a to the second movement restriction groove 7b, thereby causing the cam member 55 to move slightly in the sideways direction. Then, when the disc tray 5 reaches the disc loaded position, the protrusion 59 of the cam member 55 has moved to the third movement restriction groove 7c via the second movement restriction groove 7b, thereby enabling the cam member 55 to move from the first position to the second position, which in turn also makes it possible for the planetary arm 66 to rotate. In this state, the operative gear 65 moves from the first rack 6a to the second rack 6b.

In this state, the movement of the disc tray 5 is restricted while the planetary arm 66 is capable of revolution. Therefore, if the operative gear 65 is rotated by the loading motor 61, the operative gear 65 moves and turns along the arc-shaped second rack 6b around the axis 64b. Therefore, in this state, the operative gear 65 acts as a planetary gear.

When the operative gear 65 acts as a planetary gear and moves along the arc-shaped second rack 6b as described above, the planetary arm 66 also rotates in accordance with the movement of the operative gear 65, around the revolution axis (common axis) 64b in the clockwise direction shown in FIG. 3. When the planetary arm 66 rotates in this way, the second arm 66c of the planetary arm 66 also rotates in the same manner in the clockwise direction, thereby causing the cam member 55 to move from the first position to the second position.

In accordance with the movement of the cam member 55, the guide pins 430a, 430b of the front end of the base frame 43 of the mechanism unit 42 slide along the slanting grooves 582 of the cam grooves 58a, 58b and move upward to the upper grooves 581. Accordingly, the mechanism unit 42 is displaced from the lowered position to the raised position, whereby the center hub 46a of the turntable 46 fits into the central hole 3a of the optical disc 3 which is placed on the disc tray 5 and has been transported to the disc loaded position. Then, the disc damper 80 is pulled by the pulling force of the permanent magnet 46b of the turntable 46, and then the optical disc 3 is clamped between the turntable 46 and the disc damper 80.

In this state, if an operation such as a playback operation is carried out, the spindle motor 45 is operated to rotate the turntable 46 in prescribed speeds, thereby making it possible to playback the optical disc 3 or record information thereto. On the other hand, when playback is finished or when playback is stopped in order to switch to another disc, the eject button is pushed after operation of the playback switch (i.e., an operation to stop playback). When this is done, the operation described above for ejecting the disc tray 5 is carried out to eject the disc tray 5 on which the optical disc 3 is placed, to the outside of the main body 2.

Hereinafter, a description is made with regard to the operation of the optical pick-up moving mechanism 48, when playing back or recording the optical disc 3, to which the positioning structure of the flexible printed circuit according to the present invention is applied.

First, the sled motor 480 is driven to move the optical pick-up 47, the lead screw 481 is rotated by the rotation of the rotational shaft 480a. In this case, since the rotational shaft 480a of the sled motor 480 is being slightly oscillated by applying a pulse voltage at a 40 Hz to the coil of the sled motor 480, it is possible to start the motor without applying a large voltage.

When the lead screw 481 is begun to rotate in an anti-clockwise direction viewed from the tip of the rotational shaft 480a (in the direction indicated by the arrow A in FIG. 8(a)), the rotational shaft 480a is displaced toward its tip direction according to the rotation. However, when the tip of the rotational shaft 480a is displaced for the predetermined distance "d", the tip of the rotational shaft 480a abuts the stopper 487, and thereby further displacement being restricted. In this way, it is possible to avoid increase of the load exerted on the motor being rotated, by the abutment of the bearing of the motor against the collar or thrust washer inside the motor. Further, it is also possible to minimize the delay of the start of the pick-up when the motor is started to rotate.

Further, because there is no resistance exerted on the rotation shaft 480a by a plate spring or the like which is used in the prior art to push a rotation shaft 480a toward the base end, it is possible to smoothly rotate the sled motor 480 without the need for a large torque. Consequently, it is possible to smoothly operate the optical pick-up moving mechanism 48, and therefore to accurately hold the objective lens 47 of the optical pick-up 47 at the center of the actuator when the optical pick-up moving mechanism 48 is operated, whereby it becomes possible to prevent the writing characteristics of a CD-R drive from being degraded.

Further, because there is no need for a large torque to rotate the sled motor 480, it is possible to use a small size motor, this resulting in reduced power consumption. Further, use of the small size motor realizes effective utilization of the space inside the disc drive, and this also makes it possible to design miniaturized disc drives.

When the lead screw 481 is rotated in the direction indicated by the arrow A in FIG. 8(a) by driving the sled motor 480 in the manner mentioned above, such rotation is transmitted in a reduced state via the worm wheel 482a and the pinion gear 482b of the reduction gear 482 and the rack gear 483, whereby the slider 484 is moved along the guide rod 485 in a direction toward the turntable 46. On the other hand, when the lead screw 481 is rotated in a direction opposite to the arrow A shown in FIG. 8(a) by the reverse rotation of the motor, this causes the slider 484 to move in a direction away from the turntable 46. In this way, the optical pick-up 47 fixed to the pick-up base 486 moves along an axial direction of the optical disc 3 placed on the disc tray 5.

In this case, the movable rage of the optical pick up 47 is limited at the positions corresponding to the innermost position and the outermost position of the optical disc, respectively, and further movement of the pick-up is restricted. Therefore, when the optical pick-up 47 moves to either of these positions, usually the worm wheel 482a is not rotated further. In this state, however, if the sled motor 480 further rotates to forcedly rotate the lead screw 481 mounted to the rotational shaft 480a, there may arise a case that the lead screw 481 is locked upon the worm wheel 482a. However, in this embodiment, since the lead angle of the teeth of the worm wheel 482a is set so as to be relatively large and the sled motor 480 is mounted such that its rotational shaft 480a is tilted to the extent corresponding to the difference between the lead angles of the lead wheel 482a and the lead screw 481, an apparent lead angle of the lead screw 481 becomes large, thus resulting in preventing such unfavorable locking state from being caused. Further, since no change is made with regard to the number of the teeth and the pitch thereof, the amount of the movement of the optical pick-up 47 per one rotation of the sled motor 480 is unchanged.

Further, even when the optical pick-up 47 moves over large range in the radial direction of the disc due to an initializing operation at starting or a track jumping operation, the flexible printed circuit 470 deforms with keeping its ideal curved form which does not disturb the movement of the optical pick-up 47 as shown in FIG. 14(a) and FIG. 14(b) within the space above the supporting plate 44, there is no risk that the flexible printed circuit 470 is caught by peripheral parts or components and that the flexible printed circuit 470 abuts on the disc 3 to damage it.

In this case, since the pair of the engaging portions 474 of the flexible printed circuit 470 are in engagement with the protruding parts 448 formed on the supporting plate 44, respectively, a pulling force caused by the movement of the optical pick-up 47 is not transmitted to the connector 472 on the printed circuit board 11. Further, since the opening 445 is closed by the closure member 476, there is less risk that dust or dirt enters into the space above the chassis 40 from the side of the printed circuit board 11 through the opening 445. Furthermore, since the connecting part between the flexible printed circuit 470 and the optical pick-up 47 is covered by the regulating member 479, a load is not applied to the connecting part by the movement of the optical pick-up. Moreover, since the flexible printed circuit 470 is extended from the optical pick-up 47 somewhat downwardly by the regulating member 479, it is possible to maintain the form of the flexible printed circuit 470 in the ideal curved forms as shown in FIG. 14(a) and FIG. 14(b) during the movement of the optical pick-up 47.

Finally, it is to be understood that the present invention can be applied to not only CD-R drives but also other disc drives such as CD-ROM drives, CD-RW drives, DVD-drives and the like.

Further, it is also to be understood that many changes and additions may be made to the embodiments described above without departing from the scope and spirit of the invention as defined in the appended Claims. The scope of the present invention will be determined only by the following claims.

What is claimed is:

1. A connecting structure of a flexible printed circuit to a pick-up used in a disc drive, the structure comprising:

a turntable for supporting a disc thereon, the turntable being driven by a motor;

a pick-up for at least reproducing information recorded on the disc to be supported on the turntable, the pick-up being movable in a radial direction of the disc;

a chassis provided with the turntable and the pick-up, said pick-up being movable with respect to the chassis in the radial direction of the disc;

a printed circuit board provided with electrical circuits for inputting and outputting electrical signals to and from the pick-up;

a flexible printed circuit connecting the pick-up and the printed circuit board; and a regulating member for regulating the extending direction of the flexible printed circuit from the pick-up to give a desired curved form to the flexible printed circuit wherein said regulating member is constructed from a separate part from the pick-up, and further wherein said regulating member is mounted to an outer surface of the pick-up around a connecting part between the flexible printed circuit and the pick-up wherein the outer surface of the pick-up has an upper surface, in which the regulating member has a flat plate portion mounted on the upper surface of the pick-up and a slanting plate portion extending slantingly and downwardly from the flat plate portion, the slanting plate portion having a tip portion which is bent roughly horizontally.

2. A pick-up assembly for use in an optical disc drive, the assembly comprising:

a pick-up slidably movable along a guide rod in a radial direction of a disc at least for reproducing information recorded on the disc, the pick-up having an outer surface;

a flexible printed circuit connected to the pick-up, said flexible printed circuit having a plurality of conductors for inputting and outputting electrical signals to and from the pick-up; and a regulating member for regulating the extending direction of the flexible printed circuit from the pick-up such that the flexible printed circuit is directed to a predetermined direction to give a desired curved form to the flexible printed circuit wherein said regulating member is constructed from a separate part from the pick-up and further wherein said regulating member is mounted to an outer surface of the pick-up around a connecting part between the pick-up and the flexible printed circuit wherein the outer surface of the pick-up includes an upper surface, in which the regulating member has a flat plate portion mounted on said upper surface of the pick-up and a slanting plate portion extending slantingly and downward from the flat plate portion, and said slanting plate portion has a tip portion which is bent roughly horizontally.

3. A connecting structure of a flexible printed circuit to a pick-up used in a disc drive, the structure comprising:

a turntable for supporting a disc thereon, the turntable being driven by a motor;

a pick-up for at least reproducing information recorded on the disc to be supported on the turntable, the pick-up being movable in a radial direction of the disc;

a chassis provided with the turntable and the pick-up, said pick-up being movable with respect to the chassis in the radial direction of the disc;

a printed circuit board arranged below the chassis and provided with electrical circuits for inputting and outputting electrical signals to and from the pick-up;

a flexible printed circuit provided between the pick-up and the printed circuit board for connecting the pick-up to the printed circuit board;

regulating means provided around a connecting part between the flexible printed circuit and the pick-up for regulating the extending direction of the flexible printed circuit from the pick-up to give a desired curved form to the flexible printed circuits wherein the pick-up has an upper surface in which the regulating means has a flat plate portion mounted on the upper surface of the pick-up and a slanting plate portion extending slantingly and downwardly from the flat plate portion, the slanting plate portion having a tip portion which is bent roughly horizontally.

4. A pick-up assembly for use in an optical disc drive, comprising:

a pick-up slidably movable along a guide rod in a radial direction of a disc at least for reproducing information recorded on the disc;

a flexible printed circuit connected to the pick-up, said flexible printed circuit having a plurality of conductors for inputting and outputting electrical signals to and from the pick-up;

a regulating member provided on the pick-up for regulating the extending direction of the flexible printed circuit from the pick-up such that the flexible printed circuit is directed to a predetermined direction to give a desired curved form to the flexible printed circuit, wherein the pick-up has an upper surface in which the regulating member has a flat plate portion mounted on said upper surface of the pick-up and a slanting plate portion extending slantingly and downwardly from the flat portion, and said slanting plate portion has a tip portion which is bent roughly horizontally.

* * * * *

UNITED STATES PATENT AND TRADEMARK OFFICE
CERTIFICATE OF CORRECTION

PATENT NO. : 6,385,156 B1
DATED : May 7, 2002
INVENTOR(S) : Furukawa et al.

It is certified that error appears in the above-identified patent and that said Letters Patent is hereby corrected as shown below:

Column 2,
Line 31, change "remain" to -- remains --
Line 46, change "Other" to -- Another --

Column 4,
Lines 1 and 13, change "planner" to -- planar --
Line 8, change "warm" to -- worm --
Line 39, change "an disc" to -- a disc --
Line 61, change "10$b$whose" to -- 10$b$ whose --
Line 63, change "bottom plate and uppercase" to -- bottom plate 10$a$ and the upper case 10$b$ --

Column 5,
Line 3, change "various IC" to -- various ICs --
Line 12, change "having roughly" to -- having a roughly --
Line 17, change "chassis is open" to -- chassis 40 is open --
Line 29, change "rectangular shape" to -- rectangular shaped --
Line 34, change "opening" to -- opening, --

Column 6,
Line 50, change "occurring" to -- occurring, --

Column 8,
Line 11, change "damper" to -- clamper --

Column 11,
Line 36, change "and flexible" to -- and the flexible --
Line 46, delete "the"

Column 12,
Line 54, change "is connected" to -- to be connected --

Column 13,
Line 64, change "aroughly" to -- a roughly --

Column 15,
Line 38, change "rotatablly" to -- rotatably --

UNITED STATES PATENT AND TRADEMARK OFFICE
CERTIFICATE OF CORRECTION

PATENT NO. : 6,385,156 B1
DATED : May 7, 2002
INVENTOR(S) : Furukawa et al.

It is certified that error appears in the above-identified patent and that said Letters Patent is hereby corrected as shown below:

Column 16,
Lines 66 and 67, change "damper" to -- clamper --

Column 19,
Lines 15 and 18, change "damper" to -- clamper --

Signed and Sealed this

Twenty-third Day of March, 2004

JON W. DUDAS
*Acting Director of the United States Patent and Trademark Office*